United States Patent
Okamura

(10) Patent No.: US 8,386,877 B2
(45) Date of Patent: Feb. 26, 2013

(54) COMMUNICATION SYSTEM, TRANSMITTER, ERROR CORRECTING CODE RETRANSMITTING METHOD, AND COMMUNICATION PROGRAM

(75) Inventor: Toshihiko Okamura, Tokyo (JP)

(73) Assignee: NEC Corporation, Tokyo (JP)

( * ) Notice: Subject to any disclaimer, the term of this patent is extended or adjusted under 35 U.S.C. 154(b) by 501 days.

(21) Appl. No.: 12/677,473

(22) PCT Filed: Sep. 12, 2008

(86) PCT No.: PCT/JP2008/066573
§ 371 (c)(1),
(2), (4) Date: May 3, 2010

(87) PCT Pub. No.: WO2009/035096
PCT Pub. Date: Mar. 19, 2009

(65) Prior Publication Data
US 2010/0281327 A1    Nov. 4, 2010

(30) Foreign Application Priority Data

Sep. 12, 2007 (JP) ................. 2007-237042
Nov. 30, 2007 (JP) ................. 2007-310782

(51) Int. Cl.
*H03M 13/00* (2006.01)
(52) U.S. Cl. ........ 714/751; 714/755; 714/758; 714/781; 714/801
(58) Field of Classification Search .......... 714/748, 714/751, 755, 781, 801
See application file for complete search history.

(56) References Cited

U.S. PATENT DOCUMENTS

| | | | | |
|---|---|---|---|---|
| 6,434,717 | B1 * | 8/2002 | Fujii | 714/758 |
| 7,000,174 | B2 * | 2/2006 | Mantha et al. | 714/790 |
| 7,289,547 | B2 * | 10/2007 | Trezza et al. | 372/50.21 |
| 7,366,272 | B2 * | 4/2008 | Kim et al. | 375/377 |
| 7,492,751 | B2 * | 2/2009 | Kim | 370/342 |
| 7,496,079 | B2 * | 2/2009 | Kim et al. | 370/342 |

(Continued)

FOREIGN PATENT DOCUMENTS

| | | |
|---|---|---|
| JP | 2004-253959 A | 9/2004 |
| WO | 2004/107640 A1 | 12/2004 |

(Continued)

OTHER PUBLICATIONS

Uwe Dammer, et al., "A Data Puncturing IR-Scheme for Type-II Hybrid ARQ Protocols using LDPC Codes", Global Telecommunications Conference, 2004, Dec. 2004, pp. 3012-3016, vol. 5.

(Continued)

*Primary Examiner* — Esaw Abraham
(74) *Attorney, Agent, or Firm* — Sughrue Mion, PLLC

(57) ABSTRACT

Intended is to achieve, in a wide range of an SN ratio, throughput on the same order of that attained by a method based on puncturing and improve computational complexity of decoding processing at a high coding rate. In a communication system for transmitting an error correcting code for an error on a communication path from a transmitter to a receiver, the transmitter divides information bits of a code word to be transmitted into a plurality of blocks based on a request for retransmission of an error correcting code from the receiver, generates an error correcting code by compact-coding of one block among the plurality of blocks and transmits the generated error correcting code.

20 Claims, 19 Drawing Sheets

U.S. PATENT DOCUMENTS

| | | | | |
|---|---|---|---|---|
| 7,523,377 | B2 * | 4/2009 | Halter | 714/755 |
| 8,065,579 | B2 * | 11/2011 | Hoshino et al. | 714/748 |
| 2007/0162811 | A1 | 7/2007 | Matsumoto et al. | |
| 2007/0277082 | A1 | 11/2007 | Matsumoto | |

FOREIGN PATENT DOCUMENTS

| | | |
|---|---|---|
| WO | 2005/107081 A1 | 11/2005 |

OTHER PUBLICATIONS

Fei Zesong, et al., "Type II Hybrid-ARQ Schemes of LDPC Codes Based on Information-Nulling Rate-Compatible Algorithm", ITS Telecommunicating Proceedings, Jun. 2006, pp. 569-572.

Mohammad R. Yazdani, et al., "On Construction of Rate-Compatible Low-Density Parity-Check Codes", Communications Letters, IEEE, Mar. 2004, pp. 159-161, vol. 8, No. 3.

Stephen B. Wicker, "Error Control Systems for Digital Communication and Storage", Prentice-Hall, Inc. Chapter 15, 1995.

David J. C. MacKAY, "Good Error-Correcting Codes Based on Very Sparse Matrices", IEEE Transactions on Information Theory, Mar. 1999, pp. 399-431, vol. 45, No. 2.

Jing Li, et al., "Rate-Compatible Low Density Parity Check Codes for Capacity-Approaching ARQ Schemes in Packet Data Communications", Proceeding of International Conference on Communications, Internet and Information Technology, Nov. 2002, pp. 789-795.

Mohammad R. Yazdani, et al., "On Construction of Rate-Compatible Low-Density Parity-Check Codes", IEEE Communications Letters, Mar. 2004, pp. 159-161, vol. 8, No. 3.

* cited by examiner

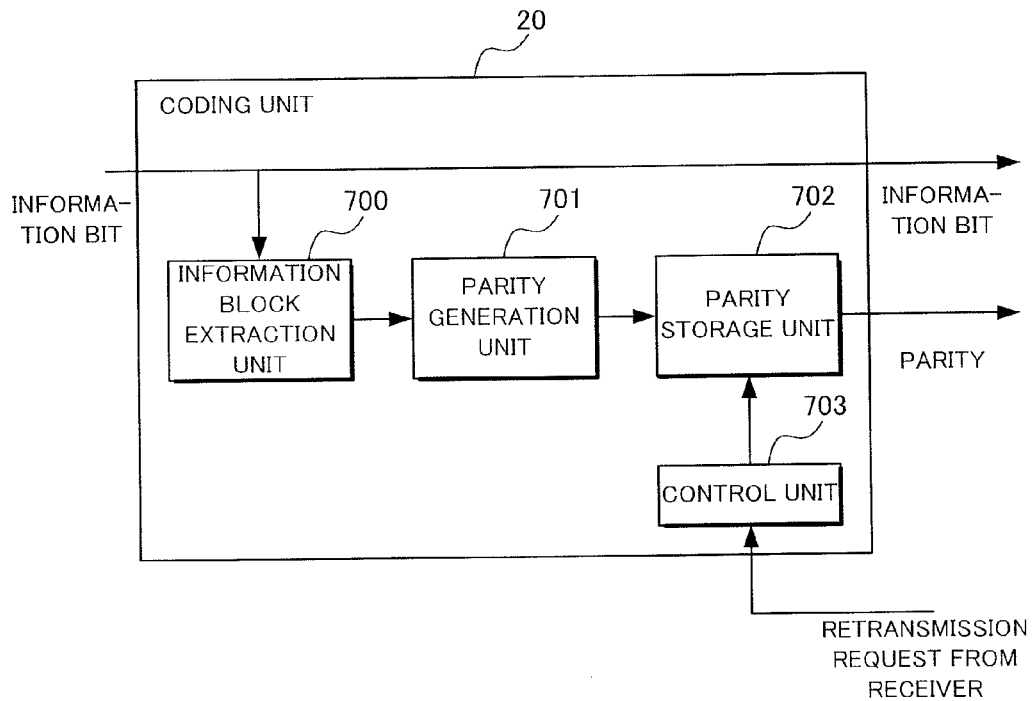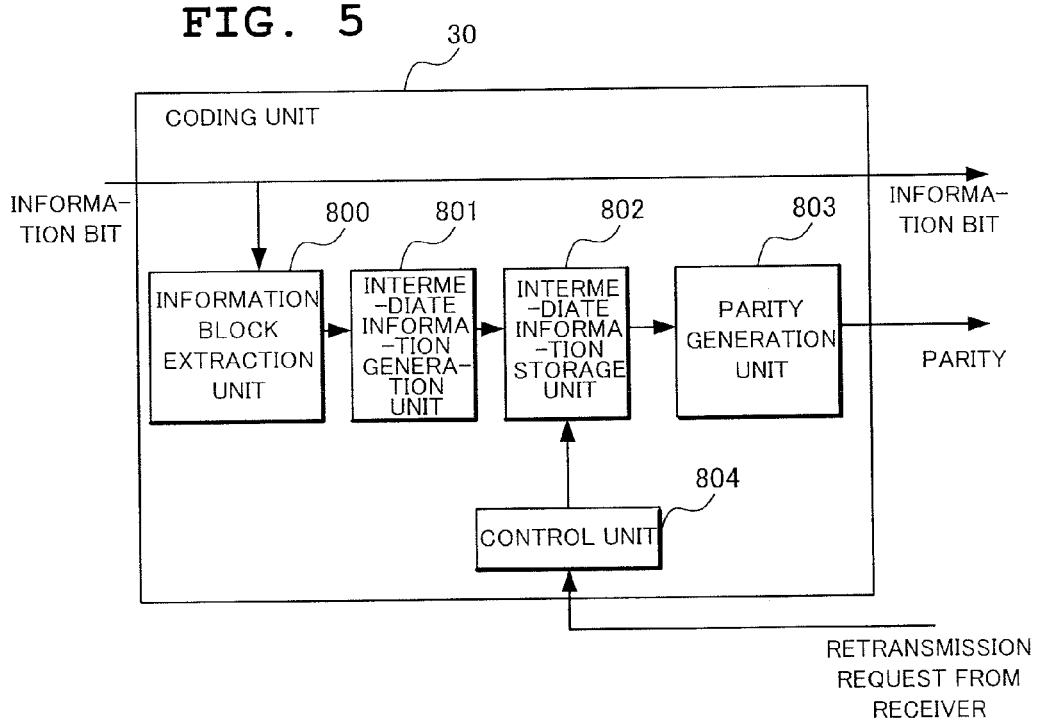

FIG. 14

$$H = \begin{pmatrix} \overbrace{\begin{matrix} 1 & 1 & 1 \end{matrix}}^{H(0,0)} & \overbrace{\begin{matrix} 1 & 1 & 1 \end{matrix}}^{H(0,2)} & \begin{matrix} 1 & 1 & 1 \end{matrix} & \overbrace{\begin{matrix} 1 & 1 & 1 \end{matrix}}^{H(0,1)} & 1 & 0 & 0 & 0 \\ 1 & 1 & 1 & 1 & 1 & 1 & 1 & 1 & 1 & 1 & 1 & 1 & 1 & 1 & 1 & 0 \\ 1 & 1 & 1 & 1 & 1 & 1 & 1 & 1 & 1 & 1 & 1 & 1 & 1 & 1 & 1 & 0 \\ 0 & 0 & 0 & 0 & 0 & 0 & 0 & 0 & 0 & 0 & 0 & 0 & 3 & 0 & 0 & 1 \end{pmatrix}$$

H(0,3) points to three columns.

FIG. 19

$$\begin{pmatrix} \begin{array}{ccc|cccc|ccc|ccc} & I(j,K) & & & P(K-j) & & & & P(4+j) & & & \\ 1 & 1 & 1 & 1 & 0 & 0 & 0 & 0 & 0 & 0 & 0 & 0 & 0 \\ 1 & 1 & 1 & 1 & 1 & 1 & 0 & 0 & 0 & 0 & 0 & 0 & 0 \\ 1 & 1 & 1 & 1 & 1 & 1 & 0 & 0 & 0 & 0 & 0 & 0 & 0 \\ 0 & 0 & 0 & 3 & 0 & 0 & 1 & 0 & 0 & 0 & 0 & 0 & 0 \\ 1 & 1 & 0 & 1 & 0 & 0 & 0 & 1 & 0 & 0 & 0 & 0 & 0 \\ 0 & 1 & 1 & 1 & 0 & 0 & 0 & 0 & 1 & 0 & 0 & 0 & 0 \\ 1 & 0 & 1 & 1 & 0 & 0 & 0 & 0 & 0 & 1 & 0 & 0 & 0 \\ 1 & 1 & 0 & 1 & 0 & 0 & 0 & 0 & 0 & 0 & 1 & 0 & 0 \\ 0 & 1 & 1 & 1 & 0 & 0 & 0 & 0 & 0 & 0 & 0 & 1 & 0 \\ 1 & 0 & 1 & 1 & 0 & 0 & 0 & 0 & 0 & 0 & 0 & 0 & 1 \end{array} \end{pmatrix}$$

INFORMATION BIT I(j,K)    PARITY P(K−j)    P(4+j)

PUNCTURE

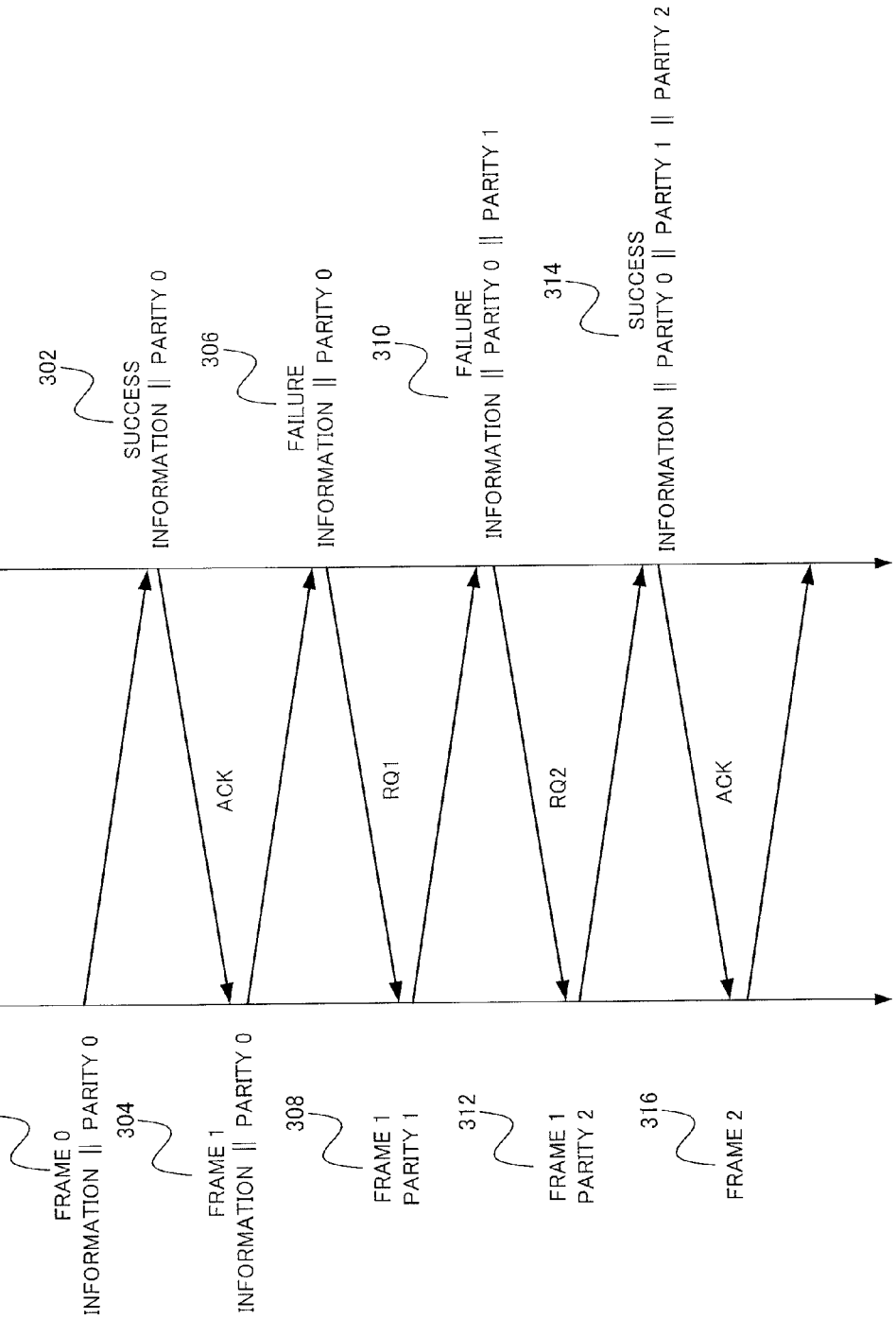

8,386,877 B2

COMMUNICATION SYSTEM, TRANSMITTER, ERROR CORRECTING CODE RETRANSMITTING METHOD, AND COMMUNICATION PROGRAM

CROSS REFERENCE TO RELATED APPLICATIONS

This application is a National Stage of International Application No. PCT/JP2008/066573 filed Sep. 12, 2008, claiming priority based on Japanese Patent Application Nos. 2007-237042 and 2007-310782, filed Sep. 12, 2007, and Nov. 30, 2007, the contents of all of which are incorporated herein by reference in their entirety.

TECHNICAL FIELD

The present invention relates to a communication system which transmits an error correcting code for an error on a communication path from a transmitter to a receiver and, more particularly, a communication system, a transmitter, an error correcting code retransmitting method and a communication program which enable improvement in computational complexity of decoding processing.

BACKGROUND ART

Error correcting code is a technique for mitigating effects of noise contained when data is transmitted by such processing as coding and decoding. Coding is processing of adding redundancy to data to be transmitted and coded data is referred to as a code word. Code word transmitted onto a communication path has such an error occurring as inversion of a part of bits of the code word at the time of reception as a result of being affected by noise. Decoding is processing of decoding data from the reception code word affected by the error by making use of redundancy. Since an error correcting code is used only in one direction of communication, it is sometimes referred to as forward error correction (FEC).

On the other hand, used is a transmission method of detecting an error occurring on a communication path by a receiver and feeding back a detection result to a transmitter to execute retransmission as required, thereby ensuring reliability. Automatic-Repeat-reQuest (ARQ) is one of representative methods of the same.

In this method, with an error detection code such as a cyclic redundancy check (CRC) added to a frame as a unit of transmission, when the receiver determines that no error occurs based on an error detection code, a signal called acknowledgement (ACK) is transmitted to the transmitter, so that the transmitter shifts to transmission processing of a subsequent frame.

Conversely, when determination is made by the receiver that an error occurs, a signal which is called a request (REQ) is transmitted to the transmitter, so that the transmitter having received the signal again transmits the frame. Repeat the transmission of the request (REQ) and the retransmission of a frame until determination is made that no error occurs.

Variations of the automatic-repeat-request (ARQ) method are known, one of which is recited in Non-Patent Literature 1, for example.

A combination between an error correcting code and an automatic-repeat-request (ARQ) method is called a hybrid ARQ, which is used in mobile communication and the like. A receiver, when receiving a transmission frame, decodes an error correcting code and when failing in the decoding, sends a retransmission request (REQ) to a transmitter. As a determination whether decoding of an error correcting code succeeds or fails, it can be detected as a result of decoding processing or by CRC for error detection added to an information series similarly to the above-described automatic-repeat-request (ARQ) method.

Throughput of the automatic-repeat-request (ARQ) method is defined as a ratio of a transmission data length including retransmission to an information bit length. For a hybrid ARQ method, making throughput be high is one of designing guidelines. Throughput in a case where no retransmission is required coincides with a coding rate of an error correcting code.

With throughput as a basis, sequentially transmitting a parity bit is effective, which is called an incremental redundancy (IR) method. In the following, the IR method will be described with reference to the drawings.

FIG. 20 is a schematic diagram showing a structure of a code word of an error correcting code, in which a parity part is divided into four groups, parities from 0 to 3. Method of sending only a part of parities in an error correcting code to improve a coding rate is called puncturing. When only a part of parities is transmitted, a correction capability according to the amount of transmission is obtained. FIG. 21 shows an example of a structure of a coding unit of a transmitter in the IR method based on puncturing, in which the coding unit comprises a parity generation unit, a parity storage unit for storing a generated parity and a control unit.

FIG. 22 shows an example of processing at a transmitter and a receiver in the hybrid ARQ based on the IR method with respect to a code shown in FIG. 13. Procedure thereof will be described in the following. It is assumed in the description set forth below that a frame represents a transmission unit and one frame corresponds to a code word.

The transmitter transmits an information bit and a parity 0 of a frame 0 (Step 1001).

The receiver executes decoding from reception values of the information bit and the parity 0 of the frame 0. Since decoding succeeds, transmit ACK to the transmitter (Step 1002).

The transmitter transmits an information bit and a parity 0 of a frame 1 (Step 1003).

The receiver executes decoding from reception values of the information bit and the parity 0. Since decoding fails, transmit REQ to the transmitter (Step 1004).

The transmitter transmits a parity 1 of the frame 1 (Step 1005).

The receiver executes decoding from reception values of the information bit and the parity 0 and the parity 1. Since decoding fails, transmit REQ to the transmitter (Step 1006).

The transmitter transmits a parity 2 of the frame 1 (Step 1007).

The receiver executes decoding from reception values of the information bit and the parity 0, the parity 1 and the parity 2. Since decoding succeeds, transmit ACK to the transmitter (Step 1008).

The transmitter transmits an information bit and a parity 0 of a frame 3 (Step 1009).

Code designing suitable for puncturing is one means for realizing an effective IR method. Therefore, even when puncturing is executed, a code needs to have such characteristics as (1) excellent weight distribution and (2) efficient decoding. When applying soft decision Viterbi decoding to a convolutional code, for example, by setting a punctured bit to be an appropriate value (soft decision value by which 0 and 1 have an equal probability), maximum likelihood decoding can be realized in exactly the same manner as that of ordinary Viterbi decoding processing. As to designing of a convolutional code assuming puncturing, studies have been conventionally made, one of which is recited, for example, in Chapter 12.5 of Non-Patent Literature 1.

In recent years, such codes having high correcting capability as a turbo code and a low-density parity-check (LDPC) code have been studied and put into practice. Decoding of these codes is executed by using an algorithm of repetitional decoding called message passing decoding in which reliability information of a code word bit is sequentially calculated. Decoding of an LDPC code is recited, for example, in Non-Patent Literature 2.

Message passing decoding of an LDPC code is executed by repeating processing called row processing and column processing.

Each row of a parity check matrix gives a constraint condition represented by a linear expression to a code word bit located at a component of non-zero. Noticing such one code word bit, when reliability information (probability of "0", "1") of other code word bits is applied, reliability information of the bit in question under the constraint condition can be calculated. In the row processing in message passing decoding of an LDPC code, the foregoing described processing is executed with respect to each code word bit corresponding to a component of non-zero.

On the other hand, in the column processing, executed is processing, with respect to each code word bit, of merging reliability information calculated in a row whose component in a column of a corresponding parity check matrix is non-zero and a reception value of the code word bit. When a reception value and reliability information are given by a logarithmic likelihood rate, the merging processing will be addition of real number values. Hard decision of a bit is made by this merged value. To each row, return a value obtained by merging reliability information and a reception value obtained by the row processing of other rows than the row itself to make the value as a subsequent input of the row processing.

Repetitional decoding of an LDPC code is executed by repeating the column processing and the row processing corresponding to each column and each row in a parity check matrix. End the decoding processing when a syndrome calculated from a hard decision value of a bit all attains "0" or reaches a predetermined number of repetitions.

Although it is not guaranteed that the repetitional decoding will be optimum decoding because it is executed on a local constraint condition, excellent characteristic can be obtained when it has such a property required of an LDPC code as a low density parity check matrix and a low rate of the number of short cycles when expressed by a graph.

Similarly to a convolutional code, puncturing is effectively applied to an LDPC code, for which studies have been made. Also as to application to a hybrid ARQ method, when codes are carefully designed, an excellent throughput on a communication path whose SN ratio has a wide range can be attained, which is recited, for example, in Non-Patent Literature 3.

Non-Patent Literature 1: S. B. Wicker, "Error Control Systems for Digital Communication and Storage", Chapter 15, Prentice-Hall, Inc. 1995.

Non-Patent Literature 2: D. J. C. Mackay, "Good Error Correcting Codes Based on Very Sparse Matrices", IEEE Transaction on Information Theory", vol. 45, No. 2, pp. 399-431, May 1999.

Non-Patent Literature 3: J. Li and K. R. Narayanan, Rate-Compatible Low Density Parity Check (RC-LDPC) Codes for Capacity-Approaching ARQ Schemes in Packet Data Communications", Proceeding of International Conference on Communications, Internet and Information Technology, November 2002, pp. 789-795.

Non-Patent Literature 4: M. R. Yazdani and A. H. Banihashemi, "On Construction of Rate-Compatible Low-Density Parity-Check Codes", IEEE Communications Letters, vol. 8, No. 3, pp. 159-161, March 2004.

In terms of a decoding device, application of puncturing is equivalent to execution of decoding based on a reception value series whose noise is large by using a code of a low coding rate. Therefore, there is a case where a disadvantage of an increase in computational complexity according to a rate of puncturing exists. In the IR method using a conventional turbo code or LDPC code based on puncturing, at a high coding rate as first transmission, large-scale puncturing is executed and convergence of repetitional decoding will be degraded as compared with a code designed targeting a high coding rate.

Possible solution to this problem is code designing in which a code of a high coding rate is first designed and then expanded to be adapted to the IR Method. In a case of an LDPC code, codes are designed so as to achieve excellent characteristics even at a low coding rate by expanding a parity check matrix. Such a structuring method is recited, for example, in Non-Patent Literature 4.

In a method of this kind disclosed in Non-Patent Literature 4, when an expansion rate is large, a parity check matrix will be complicated to increase complexity of decoder processing.

Furthermore, as compared with a code designed targeting a low coding rate, throughput at a low coding rate will be deteriorated.

It is difficult to cover, for example, up to a coding rate of 0.5 based on a code whose coding rate is 0.8 by using the method. Also in Non-Patent Literature 4, based on an LDPC code whose coding rate is 8/13, a high coding rate is handled by puncturing. At this time, for making a coding rate be 0.8, 60% of parities should be punctured, resulting in degrading conversion of repetitional decoding.

OBJECT OF THE INVENTION

An object of the present invention is to provide a communication system, a transmitter, an error correcting code retransmitting method and a communication program which enable throughput on the order of that of a method based on puncturing in a wide range of an SN ratio to be achieved and computational complexity of decoding processing at a high coding rate to be improved.

SUMMARY

According to a first exemplary aspect of the invention, a communication system for transmitting an error correcting code for an error on a communication path from a transmitter to a receiver, wherein the transmitter comprises a coding unit which divides information bits of a code word to be transmitted into a plurality of blocks based on a request for retransmission of the error correcting code from the receiver, generates a parity bit by compact-coding one block among the plurality of blocks, and transmits a parity bit generated by the compact-coding.

According to a second exemplary aspect of the invention, a transmitter for transmitting an error correcting code for an error on a communication path to a receiver, comprising a coding unit which divides information bits of a code word to be transmitted into a plurality of blocks based on a request for retransmission of the error correcting code from the receiver, generates a parity bit of the error correcting code by compact-coding one block among the plurality of blocks, and transmits a parity bit generated by the compact-coding.

According to the present invention, since throughput on the order of that of a method based on puncturing can be achieved in a wide range of an SN ratio and a code designed targeting a high coding rate is used, computational complexity of decoding can be improved more than that by a method using puncturing.

BRIEF DESCRIPTION OF THE DRAWINGS

FIG. 4 is a block diagram showing a second example of a structure of the coding unit in the transmitter according to the present exemplary embodiment;

FIG. 5 is a block diagram showing a third example of a structure of the coding unit in the transmitter according to the present exemplary embodiment;

FIG. 14 shows a processing flow of the receiver according to the second exemplary embodiment based on the processing of the decoding unit when the parity check matrix shown in FIG. 10 is used;

FIG. 19 is a diagram showing an example of a parity check matrix of an expansion code for a compact code of the code shown in FIG. 12;

FIG. 22 is a diagram for use in explaining processing contents of a transmitter and a receiver of a hybrid ARQ based on the IR method.

EXEMPLARY EMBODIMENT

Next, exemplary embodiments of the present invention will be described in detail with reference to the drawings.
(First Exemplary Embodiment)

Figure 1:
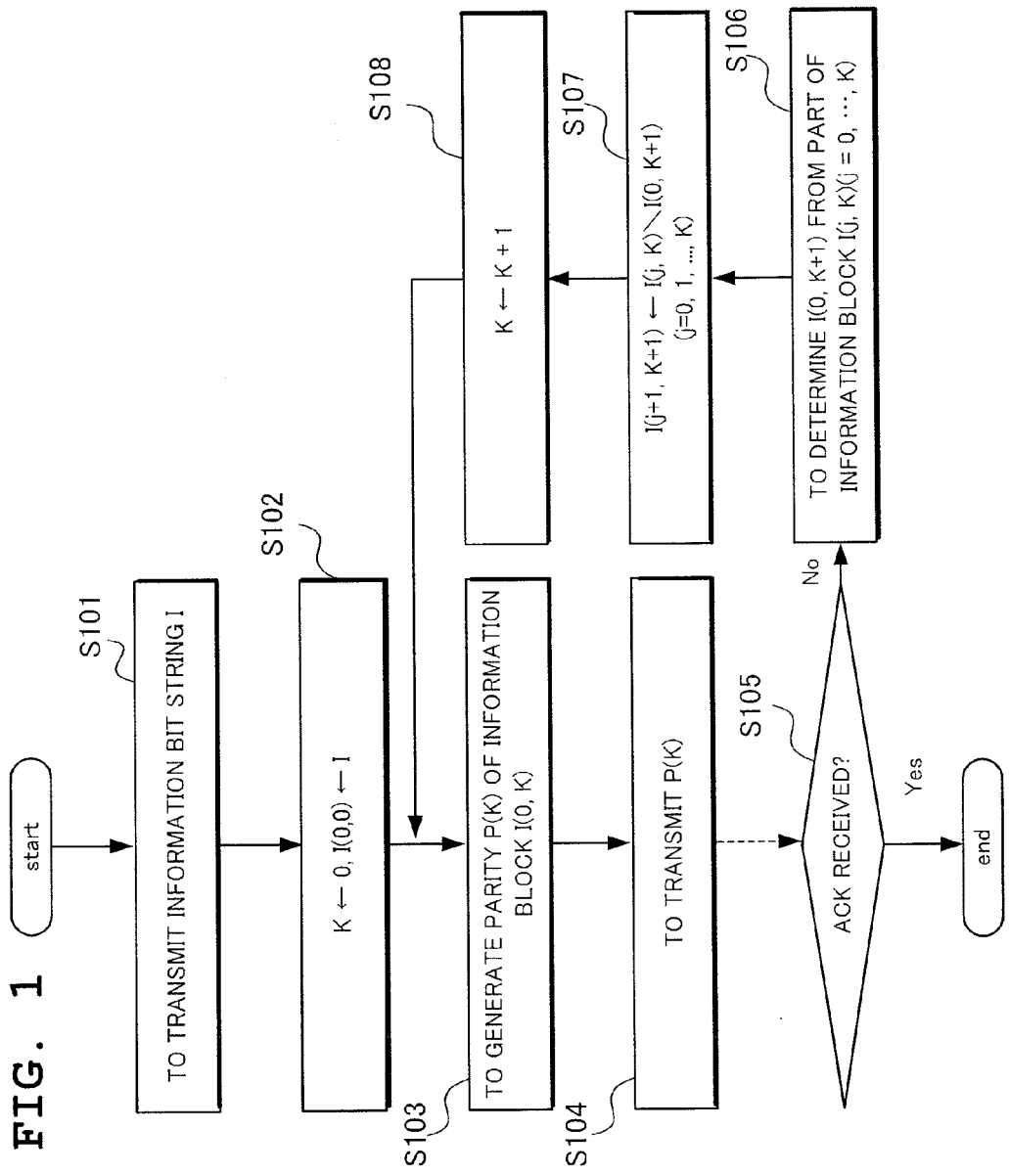
FIG. 1 is a flow chart for use in explaining contents of processing by a coding unit of a transmitter according to a first exemplary embodiment of the present invention.

FIG. 1 is a flow chart for use in explaining contents of transmission processing in a communication system based on a hybrid ARQ method according to the present exemplary embodiment of the present invention.

The IR method according to the present exemplary embodiment of the present invention is premised on a scheme in which basically a parity bit whose size is the same as that of first transmission is transmitted. The present exemplary embodiment of the present invention can be applied in combination with an IR method based on the puncturing or expansion recited in Non-Patent Literature 1 or the like.

Assume here that an index indicative of the number of transmissions is K (K=0, 1, . . . ). In the present exemplary embodiment, in response to a K-th transmission request for a certain code word, an information bit is divided into a number (K+1) of blocks to generate a parity for each one block and transmit the same. More specifically, execute compact coding to make information bits of other blocks than the block in question be "0" and calculate a parity. Since it is simple compacting, parity generation in coding is executable by the same processing.

In the following, description will be made of operation of processing by a coding unit when a transmitter transmits one code word according to the present exemplary embodiment with reference to FIG. 1.

First, transmit an information bit string I in a code word (Step S101).

Next, set the number of transmissions index K to be "0" and a block of the information bit string I (information block) in K-th transmission to be I(j,K) (j=0, 1, . . . , K) (Step S102). Here, I(0,0) is the information bit string itself.

Execute compact-coding of the information block I(0,K) to generate a parity P(K) (Step S103).

Transmit the generated parity P(K) (Step S104).

Receive feedback from a receiver (Step S105). Here, when the feedback from the receiver is an ACK (acknowledgement), end the processing to shift to transmission processing of a subsequent code word.

When receiving an REQ (retransmission request) from the receiver, collect a part of the information block I(j,K) (j=0, 1, K) to form a block I(0, K+1) of the information bits (Step S106).

Next, to a complementary set excluding a part common to I(0, K+1) from I(j,K), apply an index, I(j, K+1)=I(j+1, K)□I(0, K+1) (Step S107).

Then, set the number of transmissions index K to be "K+1" to return to Step S103 (Step S108).

Figure 2:
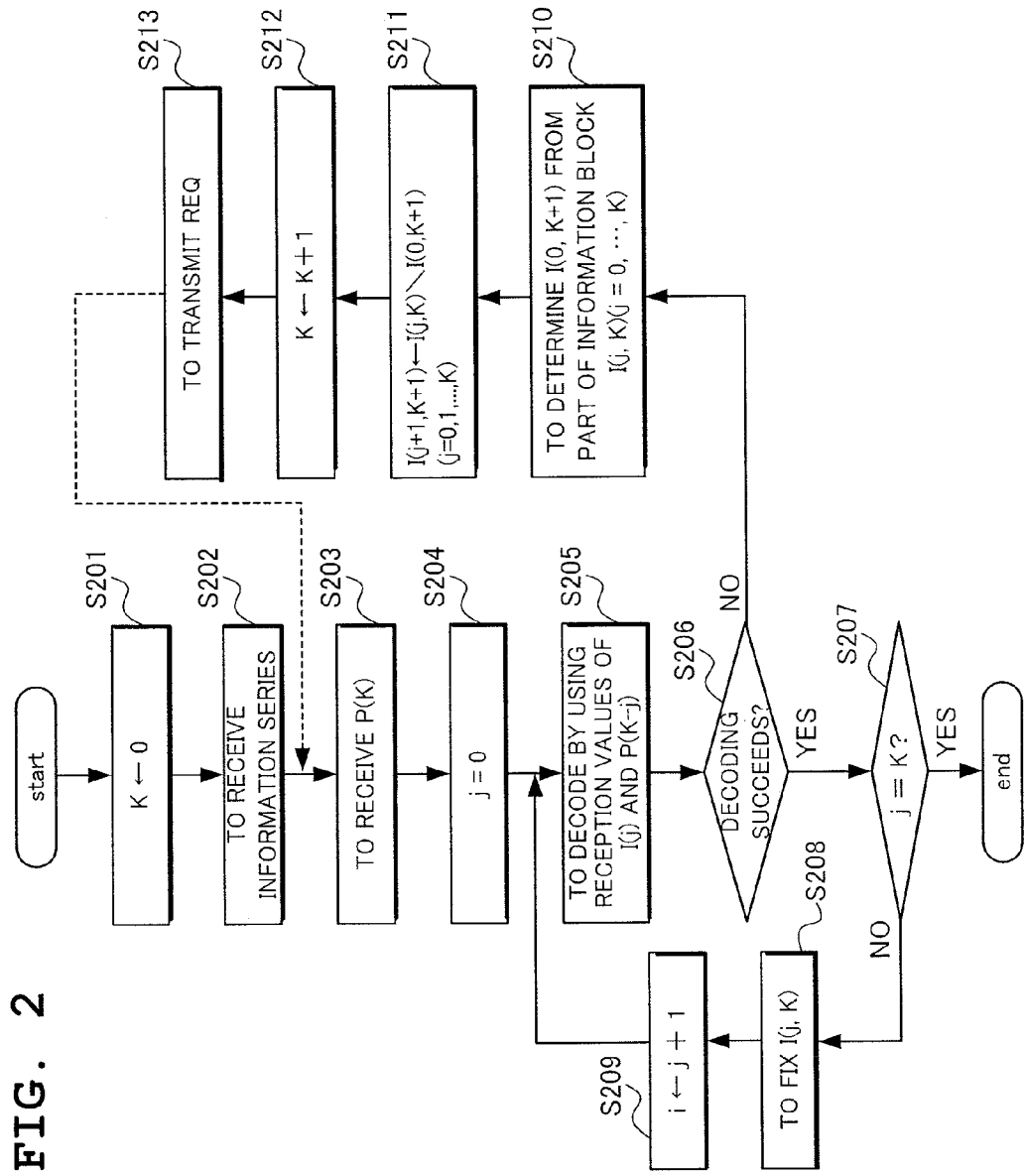
FIG. 2 is a flow chart showing operation of processing by a decoding unit in a receiver with respect to the coding procedure shown in FIG. 1.

FIG. 2 is a flow chart showing operation of processing at a decoding unit in the receiver with respect to the cording procedure shown in FIG. 1.

First, set the number of transmissions index K to be "0" and set a reception value for an information bit to receive an information bit string (Steps S201 and S202).

Set a reception value for the parity P(K) to receive the parity P(K) (Step S203).

Set an index j of an information block at the number of transmissions index K to be "0" (Step S204).

Next, execute decoding processing by using reception values for the information block I(j,K) and the parity P(K) (Step S205).

When the decoding succeeds, go to Step S207 and otherwise, shift to Step S210 (Step S206).

At Step S207, when j=K, end the decoding processing and otherwise, shift to Step S208.

When not j=K, assuming an information bit corresponding to I(j,K) is defined, fix the same (Step S208). With an LDPC code, this fixing processing is executed by setting a reception value to be large enough in accordance with a bit value or by obtaining a value (vector) with these information bits and components of a corresponding parity check matrix multiplied.

Then, set j to be j+1 and return to Step S205 to shift to the processing of a subsequent block (Step S209).

When the decoding of the information block I(j,K) and the parity P(K−j) fails at Step S206, collect a part of the I(j,K) (j=0, 1, K) to form a block I(0, K+1) corresponding to Step S106 in FIG. 1 (Step S210).

Corresponding to Step S107 in FIG. 1, also form the block I(j, K+1) of information bits (Step S211).

Set K←K+1 (Step S212) to transmit an REQ (retransmission request) to the transmitter (Step S213). Thereafter, return to Step S203.

Figure 3:
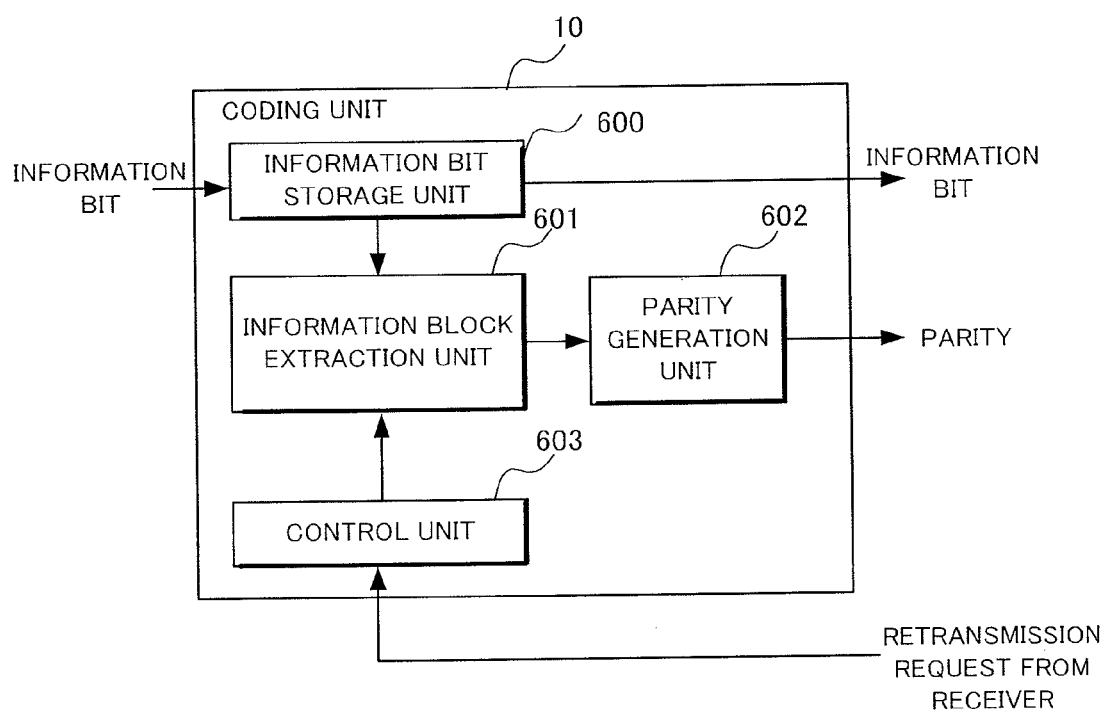
FIG. 3 is a block diagram showing a first example of a structure of the coding unit in the transmitter according to the present exemplary embodiment.

FIG. 3 shows a first example of a structure of a coding unit in the transmitter according to the present exemplary embodiment.

A coding unit 10 comprises an information bit storage unit 600, an information block extraction unit 601, a parity generation unit 602 and a control unit 603.

The information bit storage unit 600 stores information bits corresponding to a plurality of code words as required in preparation for retransmission.

The information block extraction unit 601 reads an information bit corresponding to the block I(0, K) of information bits for which a parity is generated from the information bit storage unit 600.

Control of the processing by the information block extraction unit 601 is executed by the control unit 603 based on determination of feedback information from the receiver.

The parity generation unit 602 executes compact coding based on an input from the information block extraction unit 601 to generate a parity.

FIG. 4 shows a second example of a structure of the coding unit according to the present exemplary embodiment.

A coding unit 20 comprises an information block extraction unit 700, a parity generation unit 701, a parity storage unit 702 and a control unit 703.

The information block extraction unit 700 supplies I(0, K) (K=0, 1, . . . ) to the parity generation unit 701 in advance and the parity storage unit 702 stores a generated parity.

In response to a retransmission request, a parity is selected from the parity storage unit 702 through the control unit 703 by the same manner as that described with reference to FIG. 13.

FIG. 5 shows a third example of a structure of the coding unit according to the present exemplary embodiment.

A coding unit 30 comprises an information block extraction unit 800, an intermediate information generation unit 801, an intermediate information storage unit 802, a parity generation unit 803 and a control unit 804.

In the coding unit 30, intermediate information for coding is generated by the intermediate information generation unit 801 from the I(0, K) output by the information block extraction unit 800 and stored in the intermediate information storage unit 802.

The intermediate information generation unit 801 calculates and generates intermediate information as a value (vector) obtained by multiplying I(0, K) and a component of a corresponding parity check matrix, for example. The intermediate information generation can be executed more efficiently by making an order of I(0, K) better.

While the coding unit 10 in FIG. 3 executes coding processing from the beginning at every retransmission, the coding unit 20 in FIG. 4 first calculates even a parity whose retransmission might be unnecessary. The coding unit 30 in FIG. 5 has a structure of a coding unit intended to be intermediate between those of FIG. 3 and FIG. 4, in which intermediate information for use in parity generation is generated in advance without first calculating a parity.

Hardware structures of the transmitter and the receiver according to the present exemplary embodiment are shown.

The transmitter and the receiver according to the present exemplary embodiment can be realized by the same hardware structure as that of a common computer device and comprise a CPU (Central Processing Unit) 301, a main storage unit 302 which is a main memory such as RAM (Random Access Memory) for use as a data working region or a data temporary saving region, an interface unit 303 for transmitting/receiving data, a subsidiary storage unit 304 as a hard disk device formed of a non-volatile memory such as a ROM (Read Only Memory), a magnetic disk or a semiconductor memory, and a system bus 305 which connects the above-described respective components with each other.

The transmitter and the receiver according to the present exemplary embodiment realize the operation of the processing by the coding unit and the decoding unit not only in hardware with a circuit part mounted that is formed of a hardware part such as LSI (Large Scale Integration) having a communication program realizing such functions as described above incorporated but also in software by executing the above-described communication program by the CPU 301.

More specifically, the CPU 301 loads the program stored in the subsidiary storage unit 304 into the main storage unit 302 and executes the same, thereby realizing in software the operation of the processing of the coding unit and the decoding unit.

(Effects of the First Exemplary Embodiment)

Next, effects of the present exemplary embodiment will be described.

According to the present exemplary embodiment, since a code designed targeting a high coding rate is used, decoding computational complexity can be more improved than that by the method using puncturing. Decoding computational complexity of an LDPC code designed targeting the coding rate of 0.8 will be a fraction of that obtained when an LDPC code designed to have a coding rate of 0.5 is brought to have a coding rate of 0.8 by puncturing.

In the present exemplary embodiment, it is effective to use a code which attains an excellent characteristic for a wide range of coding rates by a compact code, which can be realized also by using an LDPC code. In the present exemplary embodiment, when an additional parity is retransmitted, although a code length as a unit of decoding will be short, because throughput of a hybrid ARQ is determined by a coding gain in a high region from a frame error rate of one-tenth to one-hundredth, the effect can be suppressed. Accordingly, approximately the same order of throughput attained by the method described in the Background Art can be achieved in a region in which a communication path SNR is low and in which parity transmission is executed a plurality of times.

In the present exemplary embodiment, when additional parity retransmission is executed, a plurality of compact codes will be decoded. Structuring to sequentially execute row processing at the decoder of an LDPC code, however, enables the overhead to be suppressed and enables total decoding computational complexity even in a case of retransmission of an additional parity to be approximately in the same order of that in the method using puncturing as described in the Background Art.

(Second Exemplary Embodiment)

Although in the transmission processing shown in FIG. 1, an information block is segmented at every retransmission request, it is in practice more advantageous in some cases to use a method of assuming segmentation to a certain level and retransmitting the same block and parity at further levels in terms of a device structure and computation.

Figure 6:
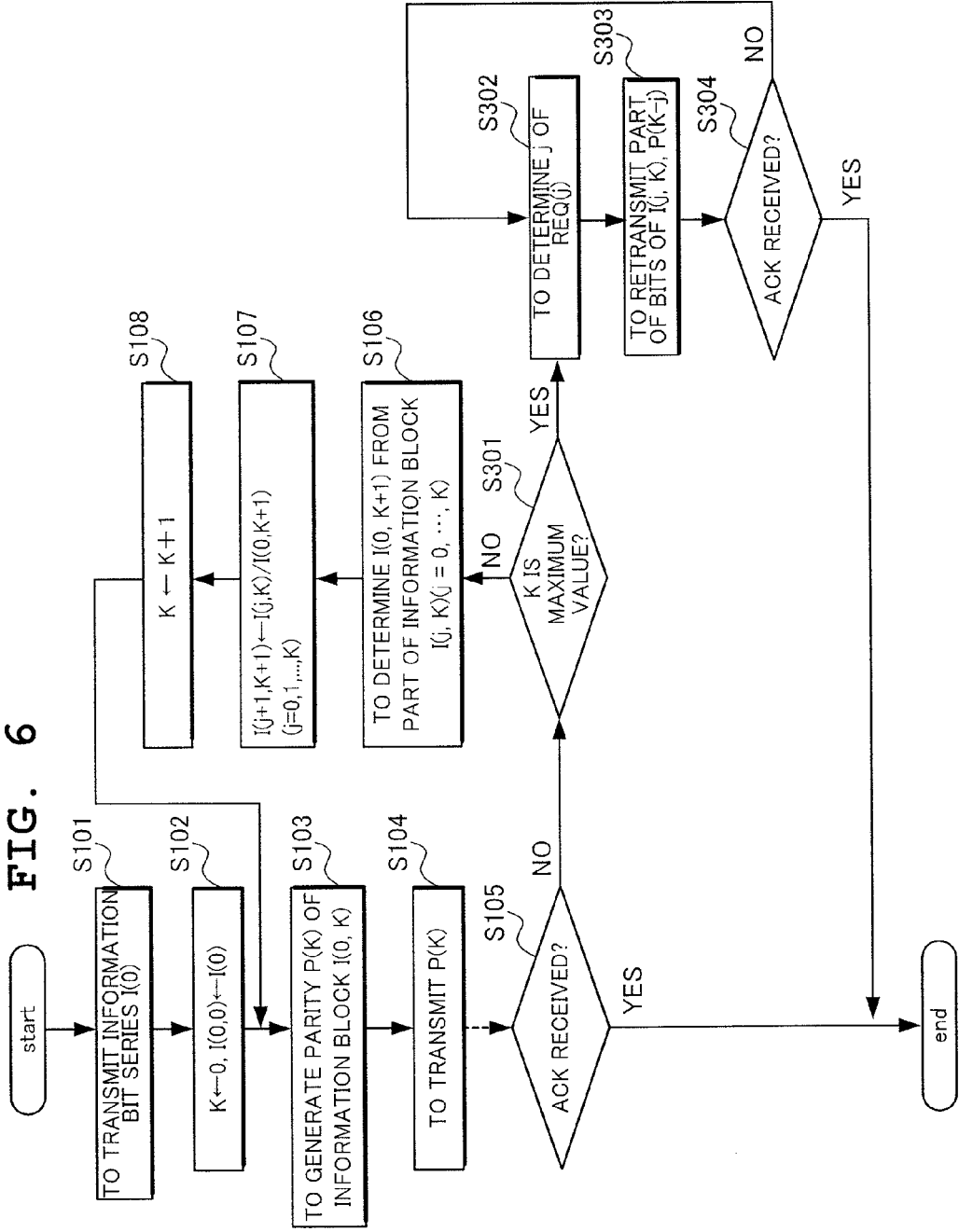
FIG. 6 is a flow chart for use in explaining processing of a transmitter when including retransmission of already transmitted information bit and parity according to a second exemplary embodiment of the present invention.

With reference to FIG. 6, description will be made of the contents of transmission processing according to a second exemplary embodiment which uses such a method as described above. In FIG. 6, since steps allotted the same reference numerals as those of FIG. 1 are common to those of FIG. 1, no details will be described thereof.

When an REQ (retransmission request) is received from a receiver in the same processing as that described with reference to FIG. 1, determine whether the number K of transmissions of an additional parity is a maximum value set in advance (Step S301).

When it is not the maximum value, segment the blocks similarly to FIG. 1 to shift to the processing of generating its parity (Steps S106 through S108).

When the number of transmissions index K is the maximum value at Step S301, feedback from the receiver is information REQ(j) including the index j of the information block I(j, K) whose decoding fails. A transmitter determines j from REQ(j) (Step S302) to execute retransmission processing related to the corresponding I(j, K) (Step S303).

At the retransmission of the same data, transmission is possible on a basis of a unit different from a size of a parity. In addition, since retransmission of an information bit is required, when the coding units shown in FIG. 4 and FIG. 5 are used, the transmitter needs to comprise a unit for storing information bits for a plurality of code words.

Figure 7:
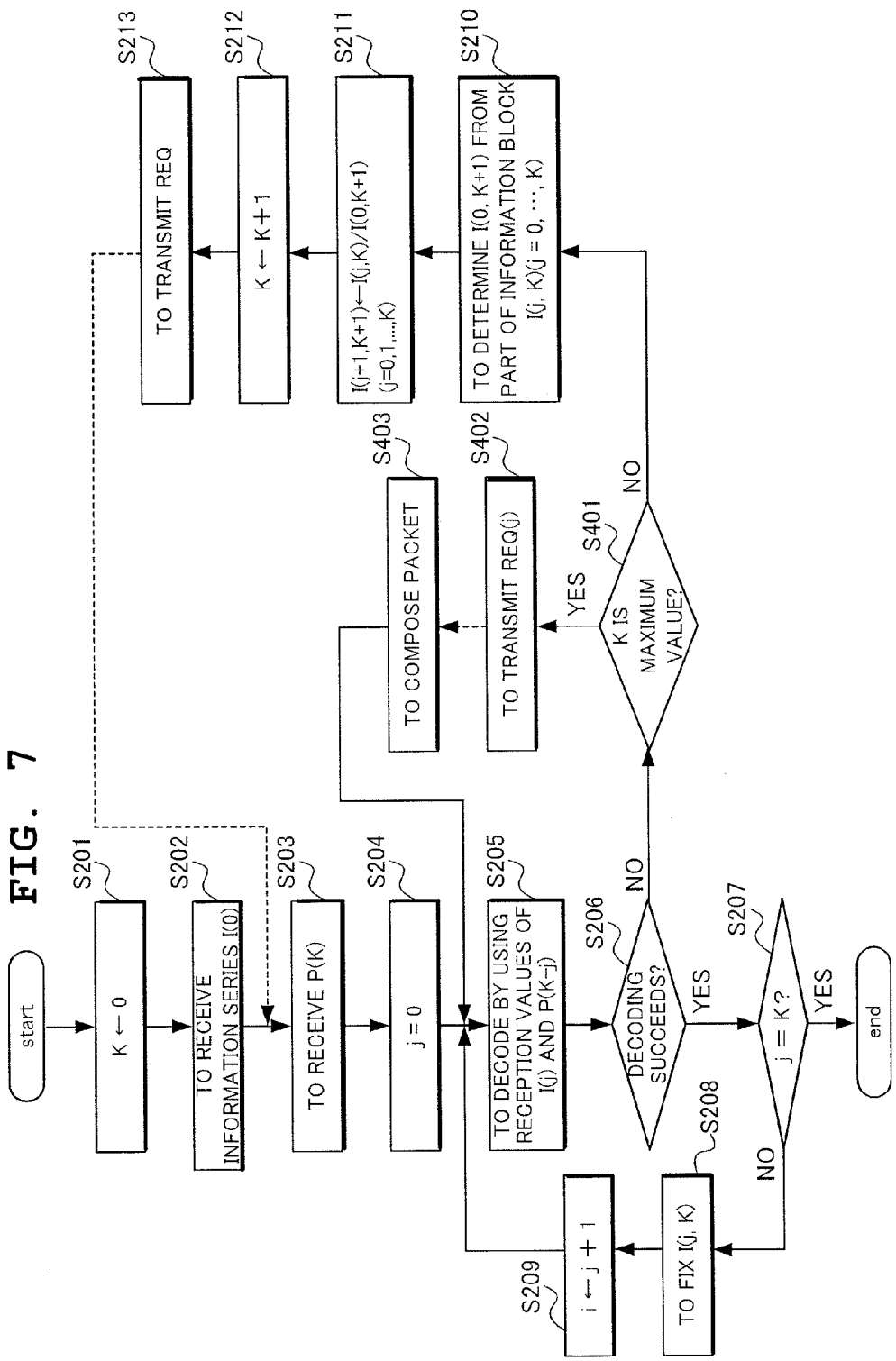
FIG. 7 is a flow chart for use in explaining processing of a receiver when including retransmission of already transmitted information bit and parity according to the second exemplary embodiment of the present invention.

FIG. 7 is a flow chart showing operation of processing at a decoding unit in the receiver with respect to the coding procedure shown in FIG. 6. In FIG. 7, since steps allotted the same reference numerals as those of FIG. 2 are common to those of FIG. 2, no details will be described thereof.

Similarly to the processing described with reference to FIG. 2, when decoding of I(j, K) and P(K−j) fails, determine whether the number K of transmissions is a maximum value (Step S401).

When the number K of transmissions is the maximum value at Step S401, send REQ(j) to the transmitter for shifting to retransmission of I(j, K) and P(K−j) (Step S402).

Execute packet composition as processing of averaging the value of the received I(j K) or P(K−j) and a previously received value (Step S403) to execute decoding processing again (Step S205).

When it is not the maximum value at Step S401, shift to Step S210 of forming the block I(0, K+1) of information bits by collecting a part of I(j, K)(j=0, 1, . . . , K).

(Effects of the Second Exemplary Embodiment)

Next, effects of the present exemplary embodiment will be described.

In addition to the effects attained by the above-described first exemplary embodiment, since the second exemplary embodiment is structured, when a block is segmented to a certain level, to retransmit the same block and parity at further levels, a device structure can be more simplified and computational complexity can be more improved as well.

(Third Exemplary Embodiment)

In a case where segmentation of an information block to a certain level is set in the present invention, unlike the second exemplary embodiment, possible is a method of transmitting, upon receiving a further retransmission request, a retransmission bit evenly to a plurality of compact codes at the level. This eliminates the need of an index j of REQ(j) that designates a compact code to be retransmitted, which is required in the second exemplary embodiment, resulting in that a simple REQ is enough.

Figure 8:
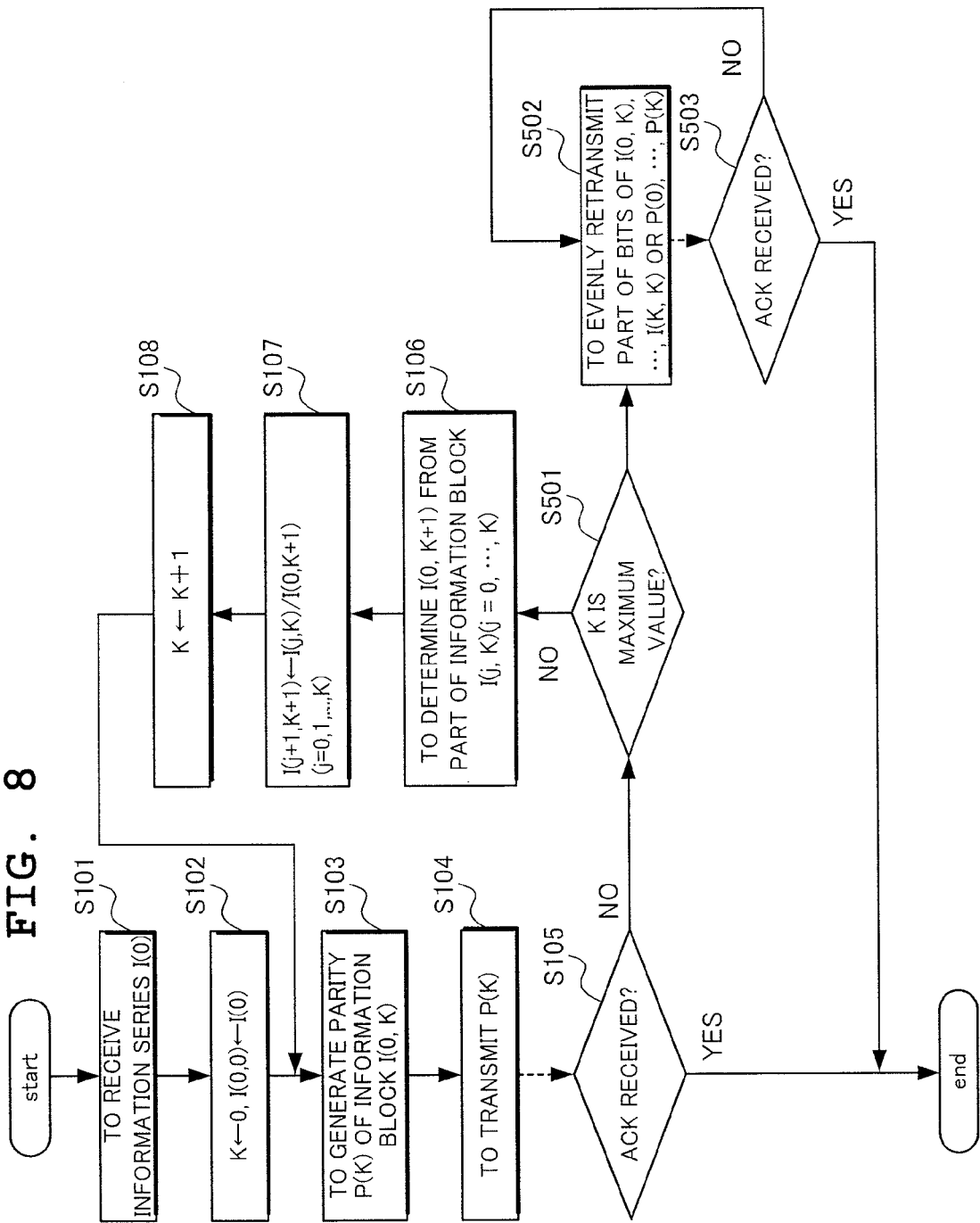
FIG. 8 is a flow chart for use in explaining processing of a transmitter when including retransmission of already transmitted information bit and parity according to a third exemplary embodiment of the present invention.

With reference to FIG. 8, description will be made of the contents of transmission processing in a third exemplary embodiment using such a method as described above. In the figure *, steps allotted the same reference numerals as those of FIG. 1 are steps common to those in FIG. 1, of which no details will be made.

When an REQ (retransmission request) is received from a receiver in the same processing as that described with reference to FIG. 1, determine whether the number K of transmissions of an additional parity is a maximum value set in advance (Step S501).

When it is not the maximum value, segment the blocks similarly to FIG. 1 to shift to the processing of generating its parity (Steps S106 through S108).

When the number K of transmissions is the maximum value at Step S501, retransmit a block formed by extracting a part of bits from I(0, K) through I(K, K) or P(0) through P(K) (Step S502).

At this time, determine whether feedback from the receiver is ACK or not (Step S503). When the feedback from the receiver is an information REQ, execute the retransmission processing of Step S502.

Similarly to the second exemplary embodiment, at the retransmission of the same data, transmission is possible on a basis of a unit different from a size of a parity. In addition, since retransmission of an information bit is required, when the coding units shown in FIG. 4 and FIG. 5 are used, a transmitter needs to comprise a unit for storing information bits for a plurality of code words.

Figure 9:
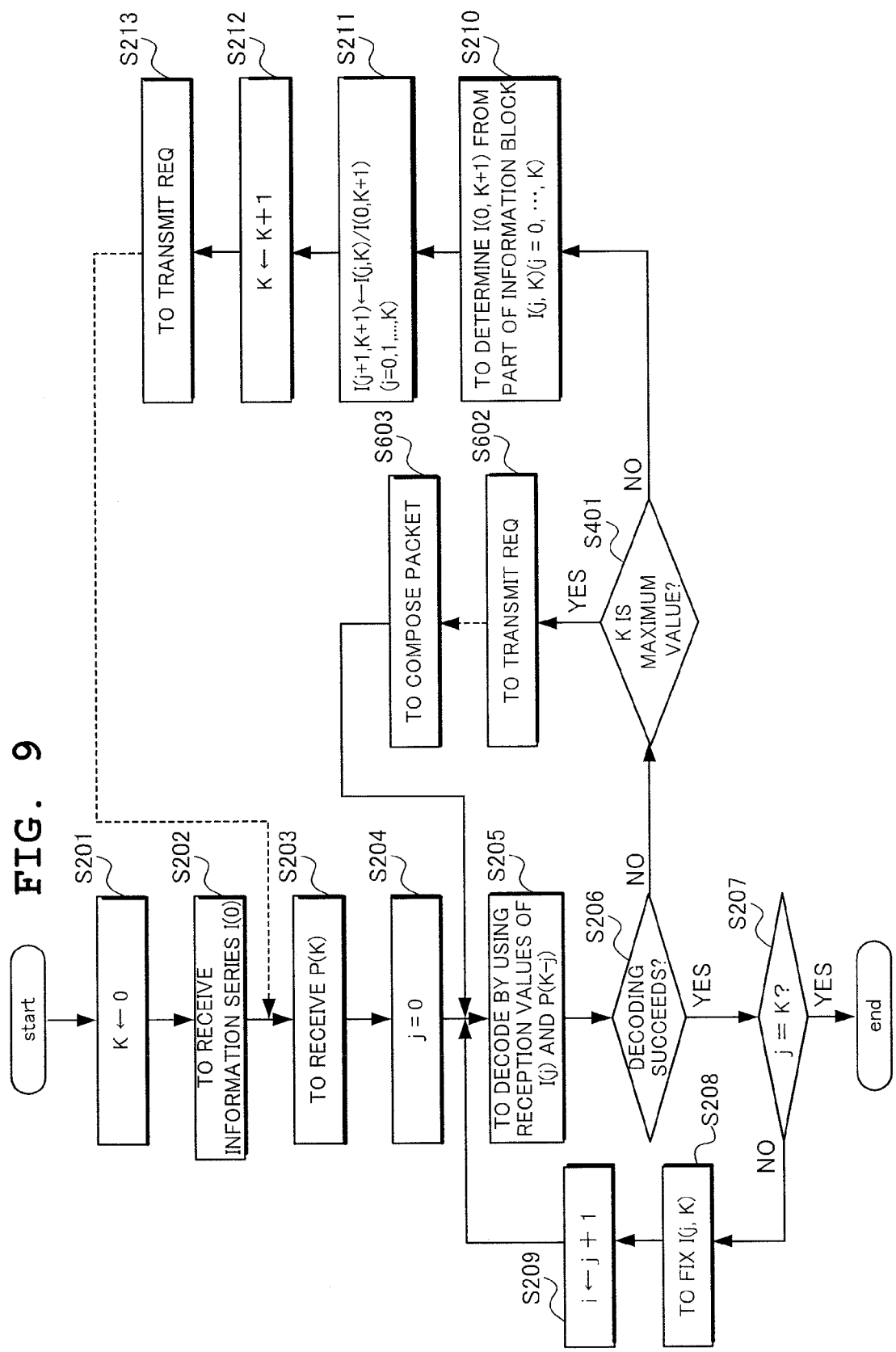
FIG. 9 is a flow chart for use in explaining processing of a receiver when including retransmission of already transmitted information bit and parity according to the third exemplary embodiment of the present invention.

FIG. 9 is a flow chart showing operation of processing at a decoding unit in the receiver with respect to the coding procedure shown in FIG. 8. In FIG. 9, since steps allotted the same reference numerals as those of FIG. 2 are common to those of FIG. 2, no details will be described thereof.

When the number K of transmissions is the maximum value, execute packet composition as processing of averaging a reception value of a part of bits of I(0, K) through I(K, K) or P(0) through P(K) and a previously received value (Step S603) to execute decoding processing starting at I(0, K) again (Steps S204 and S205).

When it is not the maximum value at Step S601, shift to Step S210 of forming the block I(0, K+1) of information bits by collecting a part of I(j, K)(j=0, 1, ..., K).

Execute decoding of I(j, K)P(K−j) sequentially starting at j=0 up to K (Steps S205 through S209).

(Effects of the Third Exemplary Embodiment)

Next, effects of the present exemplary embodiment will be described.

In addition to the effects attained by the above-described second exemplary embodiment, the third exemplary embodiment eliminates the need of addition of an index of a compact code to a signal of REQ. In the present exemplary embodiment, however, when a retransmission request is made after failing in decoding of I(j, K), retransmission is also executed related to I(i, K) whose i is i<j and which is determined to have already succeeded in decoding to execute packet composition and decoding again. When structured such that each compact code has a correction capability of the same order, however, if the number of bits to be retransmitted is fixed, there would be a case where conversely such retransmission enables efficiency to be increased. In addition, if as a result of error correction at I(i, K), determination is made that decoding is properly executed, I(j, K) cannot be properly decoded by any times of retransmission, so that the second exemplary embodiment needs a special means for coping with the problem. On the other hand, since in the third exemplary embodiment, packet composition is executed with respect to all compact codes from I(0, K) to I(K, K) without fail to resume decoding starting at I(0, K), even when error correction occurs during the processing, decoding can be retried.

(Fourth Exemplary Embodiment)

Unlike the second and third exemplary embodiments, in a case where an information block is segmented to a certain level in the present invention, a method is possible, as described in the Background Art, of generating a parity to be transmitted to each compact code by expansion of a parity check matrix at a reception of a retransmission request at a maximum level. Such a parity generated by expansion of a parity check matrix will be referred to as a parity of an expansion code.

Figure 10:
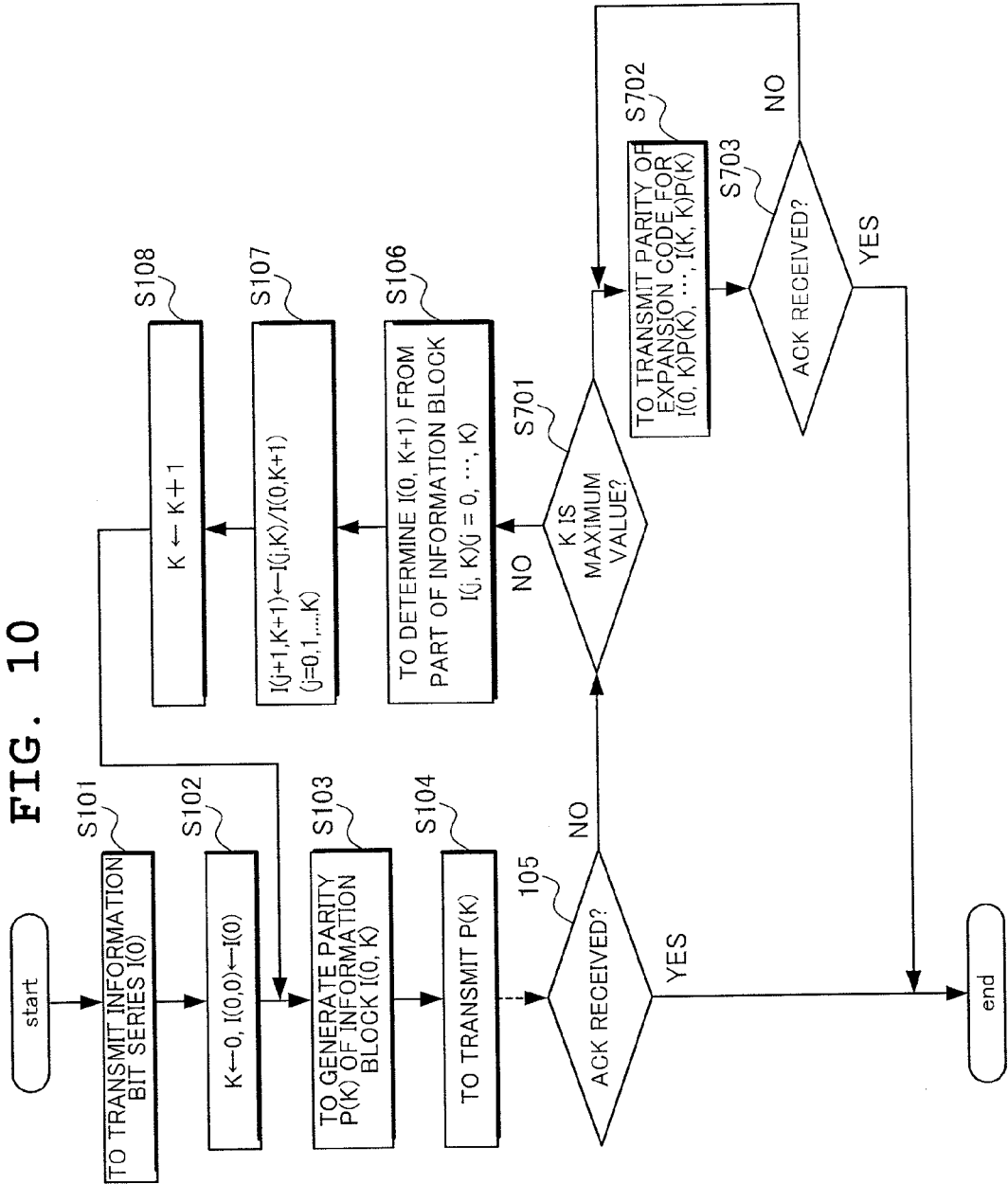
FIG. 10 is a flow chart for use in explaining processing of a transmitter when including retransmission of already transmitted information bit and parity according to a fourth exemplary embodiment of the present invention.

With reference to FIG. 10, description will be made of the contents of transmission processing according to a fourth exemplary embodiment which uses such a method as described above. In FIG. 10, since steps allotted the same reference numerals as those of FIG. 1 are common to those of FIG. 1, no details will be described thereof.

When an REQ (retransmission request) is received from a receiver in the same processing as that described with reference to FIG. 1, determine whether the number K of transmissions of an additional parity is a maximum value set in advance (Step S701).

When it is not the maximum value, segment the blocks similarly to FIG. 1 to shift to the processing of generating its parity (Steps S106 through S108).

When the number K of transmissions is the maximum value at Step S701, transmit a block formed of a parity of an expansion code of each compact code corresponding to I(0, K)P(K), I(1, K)P(K−1) through I(K, K) P(0) (Step S702).

At this time, determine whether feedback from the receiver is ACK or not (Step S703). When the feedback from the receiver is an information REQ, continue retransmission processing of Step S702.

At the retransmission of a parity of an expansion code, transmission is possible on a basis of a unit different from a size of a parity as of retransmission in the first exemplary embodiment.

Figure 11:
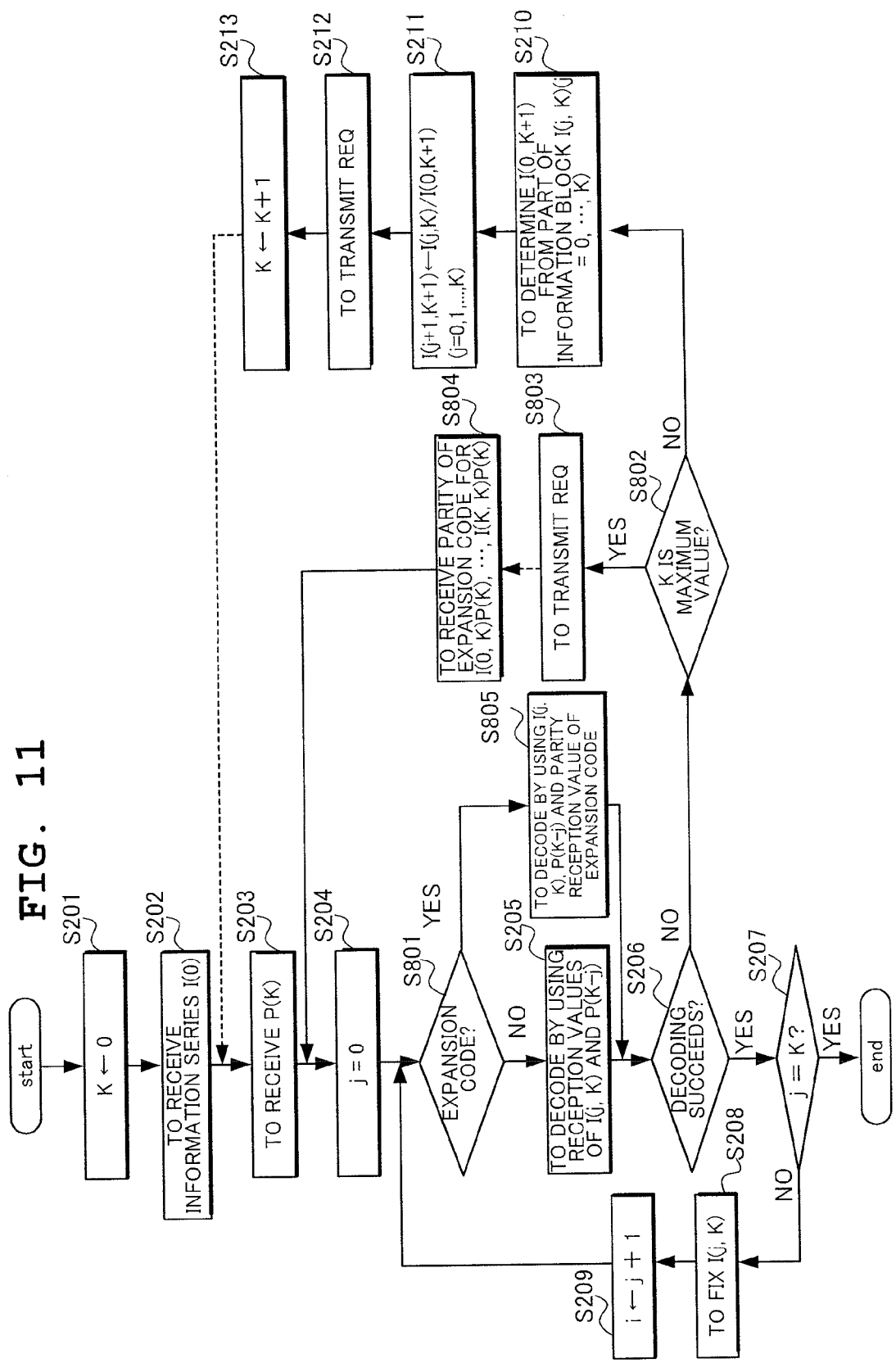
FIG. 11 is a diagram showing an example of a structure of a parity check matrix of an LDPC code appropriate for the present exemplary embodiment.

FIG. 11 is a flow chart showing operation of processing at a decoding unit in the receiver with respect to the coding procedure shown in FIG. 10. In FIG. 11, since steps allotted the same reference numerals as those of FIG. 2 are common to those of FIG. 2, no details will be described thereof.

When the number of transmissions index K is a maximum value (Step S802), receive a block formed of parities of expansion codes of compact codes corresponding to I(0, K)P(K) through I(K, K) P(0) according to the transmission processing shown in FIG. 10 (Step S803).

When it is not the maximum value at Step S802, shift to Step S210 of forming a block I(0, K+1) of information bits by collecting a part of I(j, K)(j=0, 1, ..., K).

Sequentially execute decoding of I(j, K) starting at J=0 up to K (Steps S205 through S209).

At the execution of decoding of I(j, K), determine whether a parity of an expansion code is received (Step S801). This can be realized by sequentially counting the number of retransmissions separately from K, for example.

When no parity of an expansion code is received, execute decoding processing of I(j, K)P(K−j) (Step S205). When parity of an expansion code is received, execute decoding processing of an expansion code of I(j, K)P(K−j) (Step S805).

In practice, addition of a parity by an expansion code has an upper limit fixed in terms of code designing. When reaching the upper limit, possible is combination with execution of retransmission processing of the same data similarly to the third exemplary embodiment.

(Effects of the Fourth Exemplary Embodiment)

Next, effects of the present exemplary embodiment will be described.

In addition to the effects attained by the above-described third exemplary embodiment, the fourth exemplary embodiment is expected to have as much coding gain as a reduction in throughput intended not for retransmitting the same data but for transmitting an additional parity, thereby enabling data transmission processing by a less amount of communication.

(Mode of Implementation)

In the following, a mode of implementation in which an LDPC code is applied to the present exemplary embodiment will be described.

Description will be first made of a code characteristic threshold value of an LDPC code.

A code characteristic threshold value is a threshold value of a code characteristic that is derived from message passing decoding and is determined by a degree distribution of a parity check matrix, which is also recited, for example, in Non-Patent Literature 2 and Non-Patent Literature 3.

Degree distribution of a parity check matrix is a distribution of the number of 1 in its row and column (assuming binary coding). In an LDPC code, a coding gain in a region whose target decoding error rate is high is determined by the threshold value. Since throughput of a hybrid ARQ is determined in a region whose frame decoding error rate is considerably high from 1/10 to 1/100, use of a code whose code characteristic threshold value is excellent will be effective.

It is known that an LDPC code having an excellent code characteristic threshold value can be formed by making a degree distribution of a parity check matrix be irregular.

In the present exemplary embodiment, however, because of use of a compact code of an arbitrary part, suitable is a code structure to attain an excellent code characteristic threshold value even at the time of compacting by making a degree distribution of a component corresponding to an information bit in a parity check matrix be regular and a degree distribution of a component corresponding to a parity be irregular. At this time, setting a number (K+1) of information blocks in K-th parity transmission to have the same size will result in that a code characteristic threshold value of a corresponding compact code coincides with each other.

Figure 12:
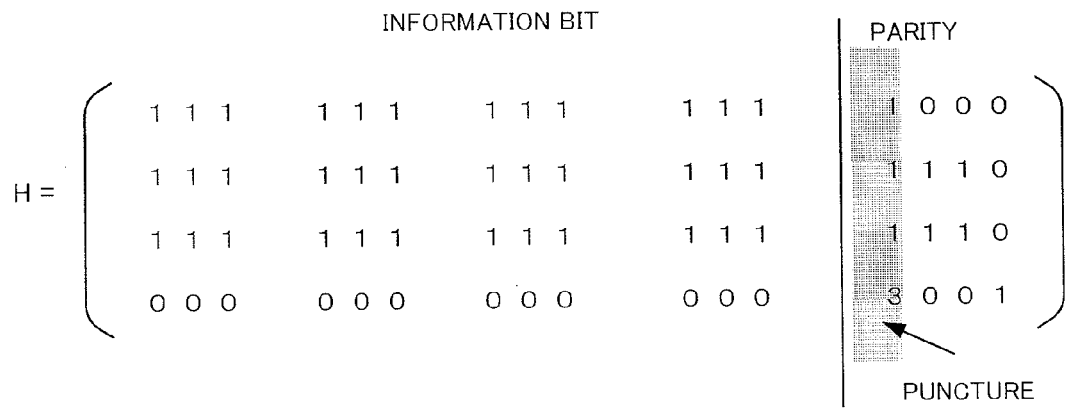
FIG. 12 is a diagram showing an example of division of the parity check matrix shown in FIG. 10 into information blocks.

FIG. 12 shows an example of a structure of a parity check matrix H of an LDPC code appropriate for the present exemplary embodiment.

Each component of the parity check matrix H shown in FIG. 12 represents a square matrix of the same size, with "0" representing a zero matrix, "1" representing a replacement matrix "1" (in each row, each column, one 1 and the remainders are all 0), and "3" representing a square matrix in which each row and each column have three 1.

Components of the parity check matrix H corresponding to information bits have a regular degree distribution having a column degree of 3 and a row degree of 12. On other hand, the parity part has column degrees of 6, 2 and 1 to make an irregular LDPC code as a whole.

As to a parity corresponding to a block whose column degree is 6, puncturing is executed without actual transmission. Therefore, the information bit will have 12 blocks and parities to be transmitted will have three blocks, resulting in having a coding rate of 12/15=0.8.

As to coding (parity generation), when a first row block is used, a parity corresponding to a component of a column degree of 6 can be obtained by simple binary addition. As to a component of a column degree of 2, which has a repeat accumulate structure, a corresponding parity can be obtained by using an accumulator. A parity corresponding to a component of a column degree of 1 can be obtained by binary addition of a parity corresponding to a component of a degree of 6.

Figure 13:
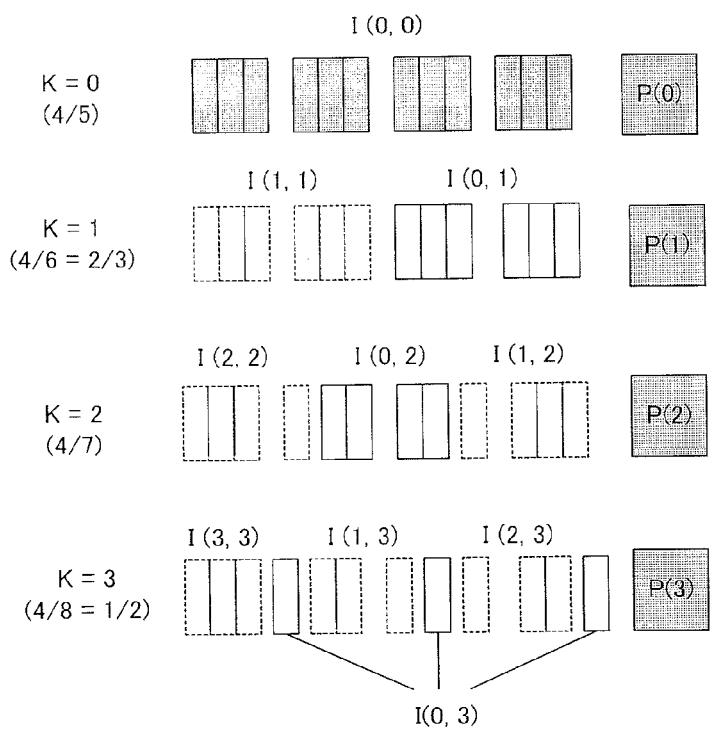
FIG. 13 is a diagram for use in explaining components of the parity check matrix shown in FIG. 10 corresponding to an information block, which is for use in coding and decoding.

As an example of a structure of an information block I(j, K) for parity generation according to the IR method in the exemplary embodiment of the present invention, shown in FIG. 13 is an example of a structure for the parity check matrix H shown in FIG. 12. Since an information bit part has a regular and even degree distribution, an information block is set to have the same size at each level.

Information bits of the parity check matrix H are naturally divided into 12 information blocks, which are represented as J(0), J(1), . . . , J(11). In addition, J (a:b) represents J(a)||J(a+1)|| . . . ||J(b) (|| represents connection).

FIG. 9 shows that an information block I(j, K) for each of K=0, 1, 2 and 3 assumes as follows:

I(0, 0)=J(0:11) (entire information series),
I(0, 1)=J(6:11), I(1, 1)=J(0:5),
I(0, 2)=J(4:7), I(1, 2)=J(8:11), I(2, 2)=J(0:3), and
I(0,3)=J(3)||J(11), I(1, 3)=J(4:6), I(2, 3)=J(8:10), I(3,3)=J(0:2).

Set a component of the parity check matrix H corresponding to I(0, K) to be H(0, K). FIG. 14 shows the parity check matrix H illustrated in FIG. 12 and H(0, K) corresponding to the above-described I(0, K). Since the last row block of the information part has all 0, it should not be included in H(0, K).

The intermediate information generation unit 801 of the coding unit 30 shown in FIG. 5 executes processing of multiplying H(0, K) by the information block I(0, K). Here, since H(0, K) has a column degree of 3, a low density, multiplication computational complexity will have a value in proportional to the size of I(0, K). The parity P(K) can be obtained by using the above-described parity generation procedure by the use of the intermediate information H(0, K)I(0, K).

Figure 15:
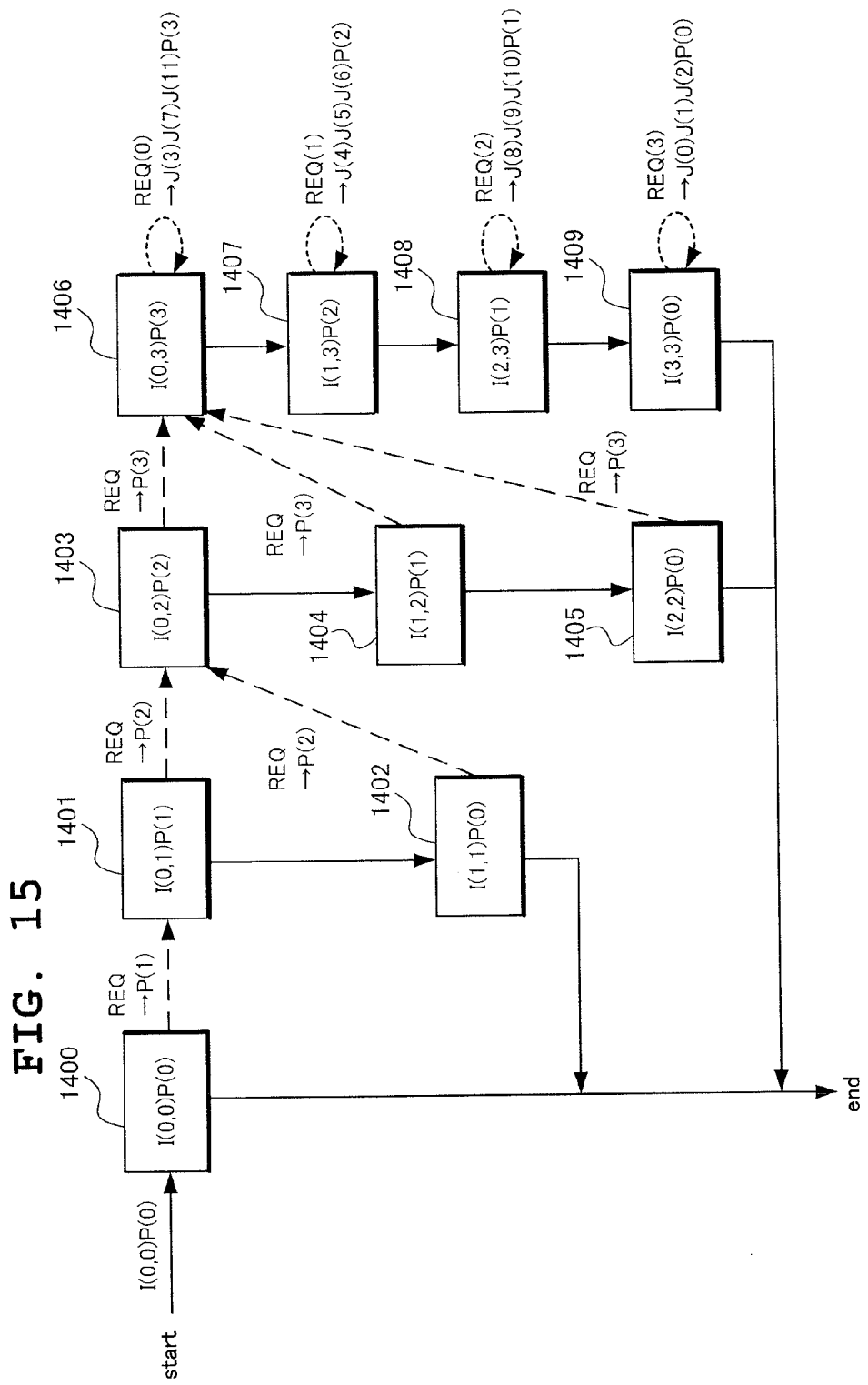
FIG. 15 is a diagram for use in explaining an example of a form of a retransmission block based on the third exemplary embodiment with respect to the parity check matrix shown in FIG. 11.

Specific example of the transmission processing and the reception processing shown in FIG. 6 and FIG. 7 for the parity check matrix H in FIG. 12 is illustrated in a state transition diagram shown in FIG. 15. In the following, FIG. 15 will be described.

The transmitter transmits I(0, 0), P(0), which is received by the decoding unit of the receiver to execute decoding (Step 1400). When the decoding fails, the receiver sends REQ to the transmitter and the transmitter transmits P(1).

The decoding unit executes decoding processing from reception values of I(0, 1)=J(6:11) and P(1) (Step 1401). Since the decoder of an LDPC code in the present exemplary embodiment decodes a compact code, a device structure enabling sequential processing of row processing will be effective.

When the decoding of I(0, 1) succeeds, execute decoding of I(1, 1)=J(0:5). The decoding can be realized by using the parity P(0) (already received) of I(0, 0)=I(1, 1)||I(0, 1).

I(0, 1) whose decoding is completed is handled by two manners. First method is a method of setting a reception value of I(0, 1) to be a high reliability information value based on a decoding result and executing decoding in the same manner as that of an ordinary case. Second method is a method of calculating intermediate information H(0, 1)I(0, 1) in the same manner as that of the coding processing and executing decoding processing by using reception values of I(1, 1) and P(0), with the intermediate information as a row processing constraint condition.

Figure 16:
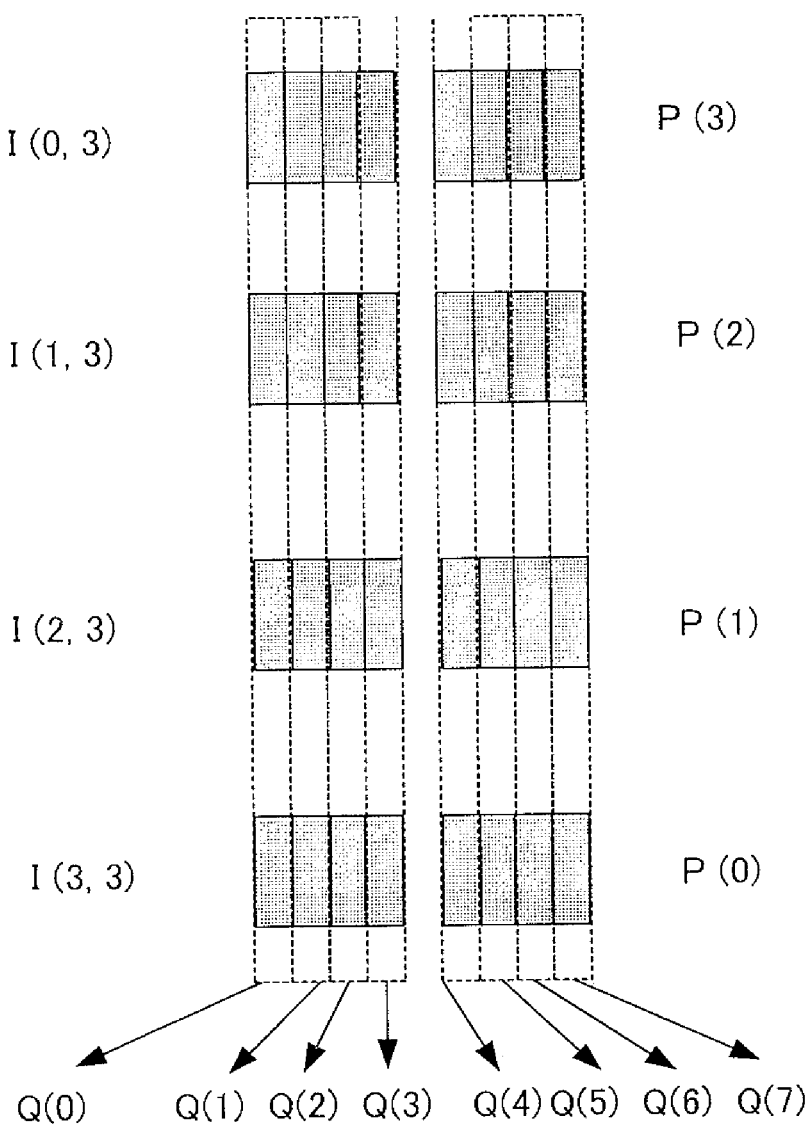
FIG. 16 shows a processing flow of the receiver according to the third exemplary embodiment based on the processing of the decoding unit with respect to the parity check matrix shown in FIG. 11.

Next, a specific example of retransmission data block generation in the third exemplary embodiment is shown in FIG. 16. Similarly to FIG. 15, FIG. 16 shows an example of data retransmission in a method in which compact decoding up to K=3 is executed with respect to the code shown in FIG. 12. Generate blocks Q(0), Q(1), Q(2) which are obtained by slicing four compact code information parts I(0, 3), I(1, 3), I(2, 3) and I(3, 3) and upon a retransmission request, sequentially transmit the same. When a further retransmission request is made after ending the transmission of the information parts, generate blocks obtained by slicing parity parts P(0), P(1), P(2) and P(3) and transmit the same.

Figure 17:
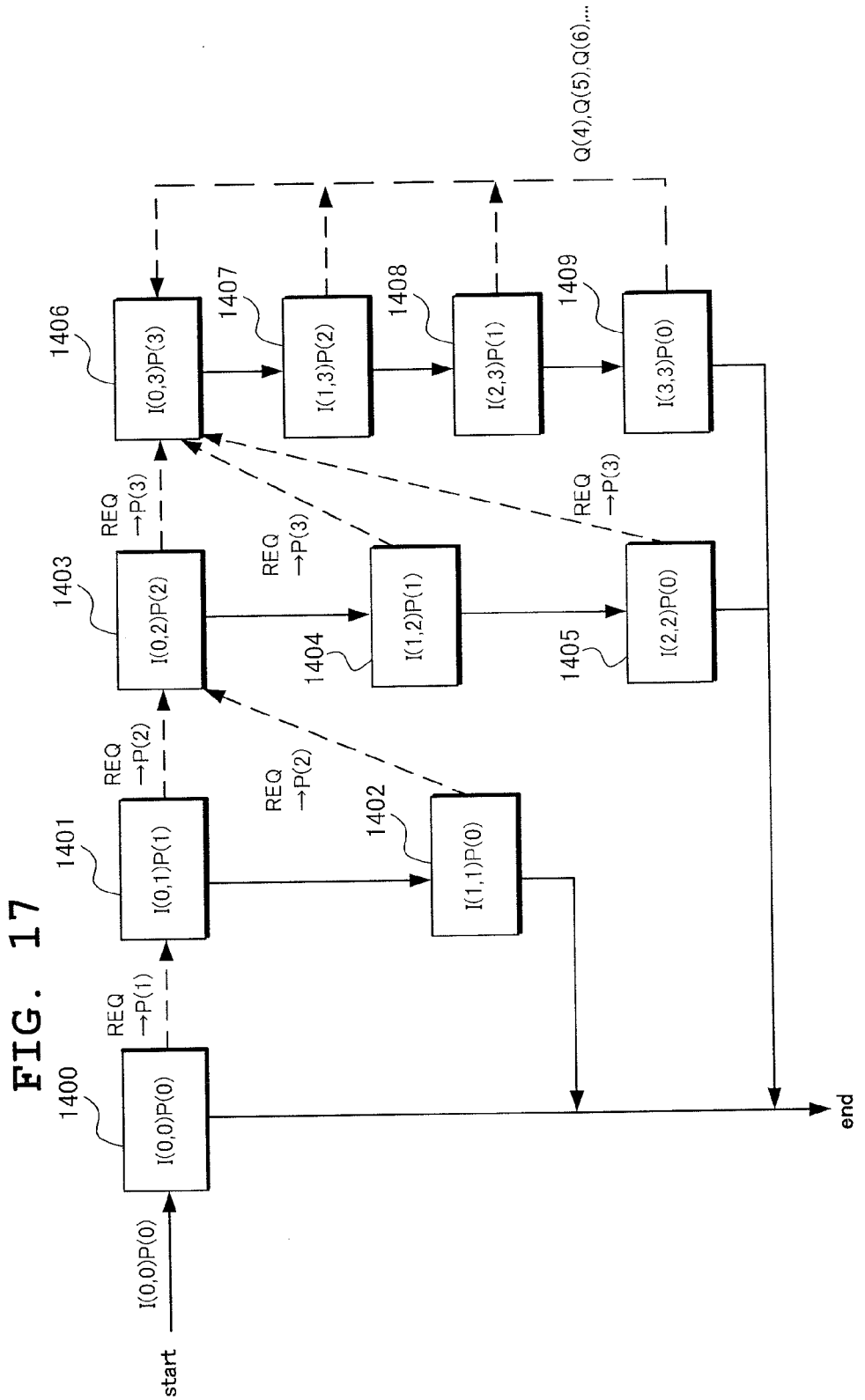
FIG. 17 is a diagram showing an example of a structure of a parity check matrix of an expansion code for a compact code at a retransmission level K=3 with respect to the parity check matrix shown in FIG. 11.

Specific example of the transmission processing and the reception processing shown in FIG. 8 and FIG. 9 for the parity check matrix H in FIG. 12 is illustrated in a state transition diagram shown in FIG. 17. Unlike FIG. 15, retransmission processing at K=3 will be extremely simple.

Figure 18:
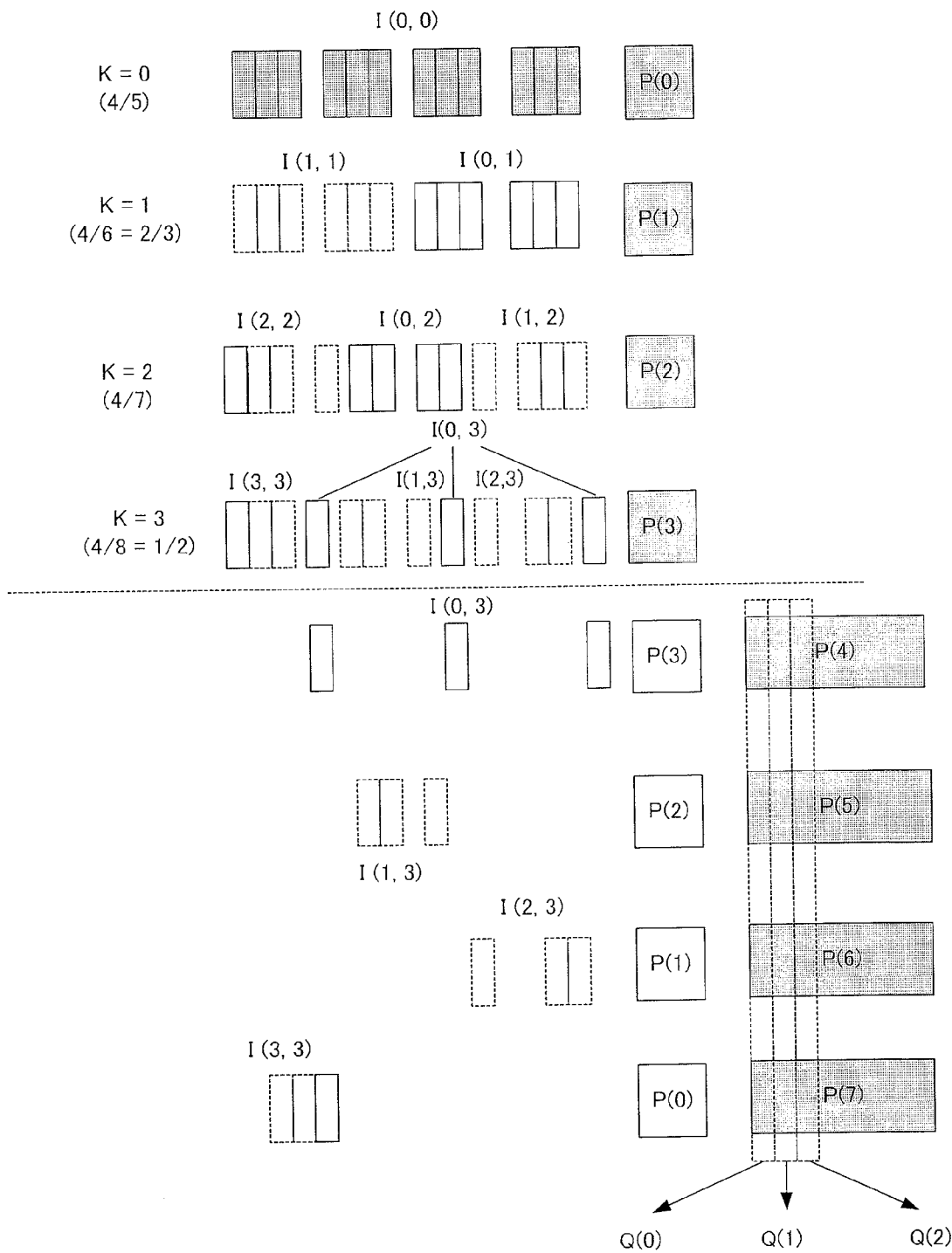
FIG. 18 is a diagram for use in explaining an example of a form of a retransmission block based on the fourth exemplary embodiment with respect to the parity check matrix shown in FIG. 11.
Figure 20:
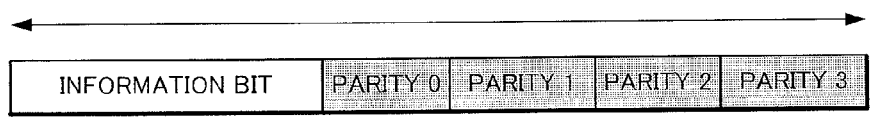
FIG. 20 is a schematic diagram showing puncturing of a code.
Figure 21:
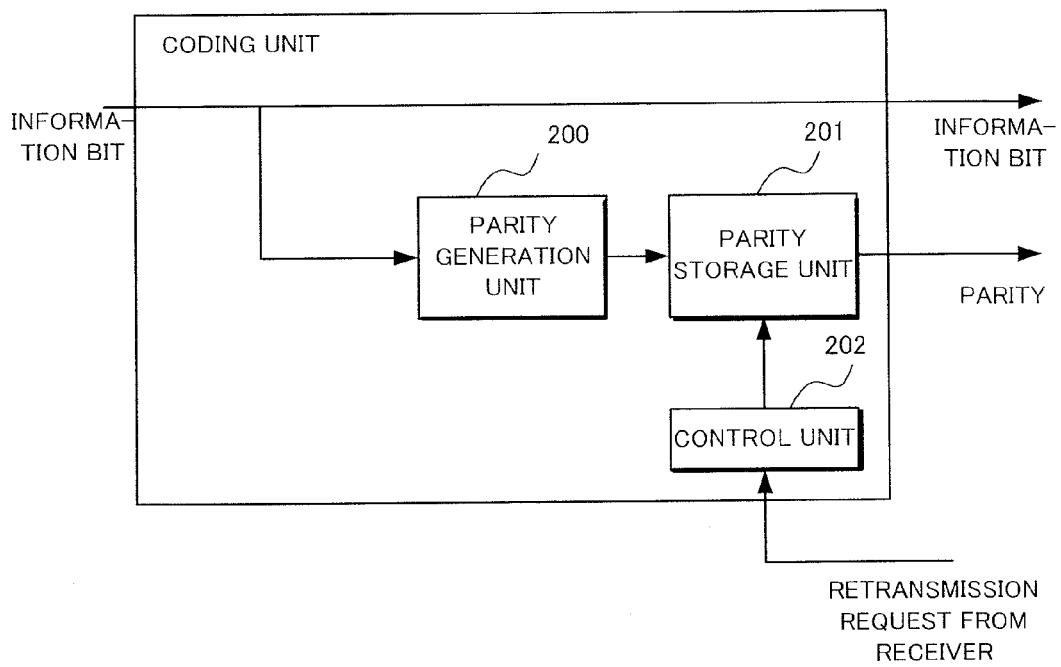
FIG. 21 is a block diagram showing an example of a structure of a coding unit in an IR method based on puncturing.

Next, shown in FIG. 18 is representation of expansion code parity generation and a transmission model in the fourth exemplary embodiment with respect to the code of FIG. 12. In FIG. 18, P(4), P(5), P(6) and P(7) represent parity parts of expansion codes of I(0, 3)P(3), I(1, 3)P(2), I(2, 3) P(1) and I(3, 3)P(0), respectively. Parity bits to be transmitted in response to a retransmission request will be blocks Q(0), Q(1), . . . which are obtained by slicing P(4), P(5), P(6) and P(7).

FIG. 19 shows an example of a parity check matrix of an expansion code for the compact code I(j, 3)P(3−j) of the code shown in FIG. 12. I(j, 3)P(3−j) is a code having a rate 1/2, whose expansion enables the structure to cope with up to rate 1/4.

Although the present invention has been described with respect to the preferred exemplary embodiments (and modes of implementation) in the foregoing, the present invention is not necessarily limited to the above-described exemplary embodiments (and modes of implementation). Structure and details of the present invention allow various modifications that those skilled in the art can understand without departing from the scope of the present invention.

Incorporation by Reference

This application is based upon and claims the benefit of priority from Japanese patent application No. 2007-237042, filed on Sep. 12, 2007 and No. 2007-310782, filed on Nov. 30, 2007, the disclosure of which is incorporated herein in its entirety by reference.

Industrial Applicability

The present invention can be used as a hybrid ARQ method in mobile communication.

What is claimed is:

1. A communication system using an error correcting code which is directed from a transmitter to a receiver in order to cope with an error, wherein said transmitter comprises a coding unit which
in response to a retransmission request when said receiver fails in decoding, transmits a parity bit string generated by compact-coding one information block among a group of information blocks obtained by dividing an information bit string of an error correcting code,
in the division into the group of said information blocks at the time of a retransmission request, generates a new first information block by collecting a part of information bits of each information block as of the current time point and executes said compact-coding with respect to the first information block, and
generates a new group of information blocks by an information block formed of a complementary set of each information block as of the current time point and said first information block and said first information block.

2. The communication system according to claim 1, wherein said first information block is generated such that an information block to be newly generated in response to a retransmission request has the same block length.

3. The communication system according to claim 2, wherein as an error correcting code, a low density parity check code is used whose information part has a regular degree distribution.

4. The communication system according to claim 1, wherein said receiver comprises a decoding unit which executes decoding of said information bit received by using a reception value of said information block of information bits, reception values of said error correcting code received so far and an already decoded information bit string, and when failing in decoding the information block of said information bits, transmits a retransmission request to said transmitter.

5. The communication system according to claim 4, wherein said decoding unit of said receiver, when failing in decoding the information block of said information bits, divides said information bits into the information blocks according to division of said information bits into information blocks by said transmitter together with a retransmission request to said transmitter.

6. The communication system according to claim 1, wherein said coding unit comprises
an information bit storage unit, and
an information block extraction unit for extracting said first information block of information bits from said information bit storage unit.

7. The communication system according to claim 1, wherein said coding unit calculates said error correcting code as of issuance of a retransmission request in advance and storing the code in an error correcting code storage unit, and upon a retransmission request, selects said error correcting code to be transmitted from said error correcting code storage unit.

8. The communication system according to claim 1, wherein said coding unit comprises
an intermediate information generation unit for calculating intermediate information as a product of the information block of said information bits and a corresponding error correcting code check matrix component, and
an intermediate information storage unit for storing said intermediate information.

9. The communication system according to claim 1, wherein said transmitter
executes division of said information bits into information blocks up to the maximum number of times determined in advance, and
retransmits an already transmitted information bit or error correcting code in response to a request for retransmission of said error correcting code whose number of times exceeds said maximum number of times.

10. The communication system according to claim 9, wherein said receiver, when receiving said information bit or error correcting code from said transmitter, executes packet composition as processing of averaging a value of said information bit or error correcting code and a previous reception value thereof.

11. A transmitter which uses an error correcting code which is directed to a receiver in order to cope with an error, comprising a coding unit which
in response to a retransmission request when said receiver fails in decoding, transmits a parity bit string generated by compact-coding one information block among a group of information blocks obtained by dividing an information bit string of an error correcting code,
in the division into the group of said information blocks at the time of a retransmission request, generates a new first information block by collecting a part of information bits of each information block as of the current time point and executes said compact-coding with respect to the first information block, and
generates a new group of information blocks by an information block formed of a complementary set of each information block as of the current time point and said first information block and said first information block.

12. The transmitter according to claim 11, wherein said first information block is generated such that an information block to be newly generated in response to a retransmission request has the same block length.

13. The transmitter according to claim 12, wherein as an error correcting code, a low density parity check code is used whose information part has a regular degree distribution.

14. The transmitter according to claim 11, wherein said coding unit comprises
an information bit storage unit, and
an information block extraction unit for extracting said first information block of information bits from said information bit storage unit.

15. The transmitter according to claim 11, wherein said coding unit calculates said parity bit as of issuance of a retransmission request in advance and storing the code in a parity bit storage unit, and upon a retransmission request, selects said error correcting code to be transmitted from said parity bit storage unit.

16. The transmitter according to claim 11, wherein said coding unit comprises
an intermediate information generation unit for calculating intermediate information as a product of the information block of said information bits and a corresponding error correcting code check matrix component, and
an intermediate information storage unit for storing said intermediate information.

17. The transmitter according to claim 11, which executes division of said information bits into information blocks up to the maximum number of times determined in advance, and retransmits an already transmitted information bit or parity bit in response to a request for retransmission of said error correcting code whose number of times exceeds said maximum number of times.

18. The transmitter according to claim 17, wherein in response to a request for retransmission of said error correcting code whose number of times exceeds said maximum number of times, transmits a block formed by collecting a part of bits of the information blocks of said information bits or a block formed by collecting a part of bits of a block of parity bits already transmitted.

19. A receiver, which, with respect to the transmitter according to claim 18, executes packet composition processing for reception data in response to a request for retransmission of said error correcting code whose number of times exceeds said maximum number of times and sequentially decodes the information blocks of said information bits starting with a first information block of said information bits.

20. The transmitter according to claim 11, which executes division of said information bit string into information blocks up to the maximum number of times of retransmission requests determined in advance, in response to a request for retransmission whose number of times exceeds said maximum number of times, generates a parity bit as an expansion code for a compact code corresponding to said information block and said parity bit already transmitted, and generates a block by collecting parity bits generated by an expansion code corresponding to said information block from the plurality of information blocks and transmits the block in response to a retransmission request.

* * * * *

UNITED STATES PATENT AND TRADEMARK OFFICE
CERTIFICATE OF CORRECTION

PATENT NO. : 8,386,877 B2  
APPLICATION NO. : 12/677473  
DATED : February 26, 2013  
INVENTOR(S) : Toshihiko Okamura Page 1 of 1

It is certified that error appears in the above-identified patent and that said Letters Patent is hereby corrected as shown below:

In the Specification

Column 2, Line 13-16: Delete "With ............... drawings." and insert the same on Col. 2, Line 12, after "code." as a continuation of the same paragraph Column 7, Line 34: Delete "(j=0, 1, K)" and insert -- (j=0, 1, ..., K) --

Column 13, Line 53: Delete "J(3) || J(11))," and insert -- J(3) || J(7) || J(11), --

Signed and Sealed this  
Twenty-first Day of October, 2014

Michelle K. Lee  
*Deputy Director of the United States Patent and Trademark Office*